(12) United States Patent
Osako et al.

(10) Patent No.: US 8,952,609 B2
(45) Date of Patent: Feb. 10, 2015

(54) DISPLAY PANEL APPARATUS AND METHOD OF FABRICATING DISPLAY PANEL APPARATUS

(75) Inventors: Takashi Osako, Kyoto (JP); Shinya Ono, Osaka (JP); Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 289 days.

(21) Appl. No.: 13/445,116

(22) Filed: Apr. 12, 2012

(65) Prior Publication Data

US 2012/0268002 A1   Oct. 25, 2012

Related U.S. Application Data

(63) Continuation of application No. PCT/JP2010/006025, filed on Oct. 8, 2010.

(30) Foreign Application Priority Data

Oct. 15, 2009   (JP) ................................ 2009-238750

(51) Int. Cl.
   *H05B 33/04*   (2006.01)
   *H01L 27/32*   (2006.01)
   *H01L 51/52*   (2006.01)

(52) U.S. Cl.
   CPC ........ *H01L 27/3276* (2013.01); *H01L 51/5228* (2013.01); *H01L 27/3258* (2013.01)
   USPC .......................................... 313/504; 313/512

(58) Field of Classification Search
   USPC ................................................ 313/498–512
   See application file for complete search history.

(56) References Cited

U.S. PATENT DOCUMENTS

| | | | |
|---|---|---|---|
| 6,380,672 B1 | 4/2002 | Yudasaka |
| 6,538,374 B2 | 3/2003 | Hosokawa |
| 6,642,651 B2 | 11/2003 | Yudasaka |
| 6,885,148 B2 | 4/2005 | Yudasaka |
| 6,900,470 B2 | 5/2005 | Kobayashi et al. |
| 6,933,672 B2 | 8/2005 | Hosokawa |

(Continued)

FOREIGN PATENT DOCUMENTS

| | | |
|---|---|---|
| JP | 2001-76887 | 3/2001 |
| JP | 2001-230086 | 8/2001 |

(Continued)

OTHER PUBLICATIONS

International Search Report and Written Opinion for PCT/JP2010/006025, dated Nov. 9, 2010 along with an english translation of ISR.

*Primary Examiner* — Anne Hines
(74) *Attorney, Agent, or Firm* — Greenblum & Bernstein, P.L.C.

(57) ABSTRACT

A display panel apparatus has a structure which is less likely to seal a planarizing film even when an electrode plate is provided on the planarizing film, and the display panel apparatus includes: a planarizing film formed on a substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate, and the electrode plate has a hole exposing a part of a surface of the planarizing film.

19 Claims, 17 Drawing Sheets

(56) References Cited

U.S. PATENT DOCUMENTS

| | | |
|---|---|---|
| 7,053,548 B2 | 5/2006 | Nakanishi |
| 7,250,718 B2 | 7/2007 | Hosokawa |
| 7,279,708 B2 | 10/2007 | Kwak et al. |
| 7,309,959 B2 | 12/2007 | Nakanishi |
| 7,364,939 B2 | 4/2008 | Yudasaka |
| 7,932,672 B2 | 4/2011 | Nakanishi |
| 7,944,142 B2 | 5/2011 | Nakanishi |
| 7,994,705 B2 | 8/2011 | Hosokawa |
| 8,120,246 B2 | 2/2012 | Shibasaki et al. |
| 8,159,124 B2 | 4/2012 | Yudasaka |
| 2002/0011783 A1 | 1/2002 | Hosokawa |
| 2002/0097363 A1 | 7/2002 | Yudasaka |
| 2002/0158835 A1 | 10/2002 | Kobayashi et al. |
| 2003/0151355 A1 | 8/2003 | Hosokawa |
| 2004/0008311 A1 | 1/2004 | Yudasaka |
| 2005/0170096 A1 | 8/2005 | Yudasaka |
| 2005/0206309 A1* | 9/2005 | Shibasaki et al. ............. 313/504 |
| 2005/0248266 A1 | 11/2005 | Hosokawa |
| 2006/0060850 A1 | 3/2006 | Kwak et al. |
| 2006/0061268 A1 | 3/2006 | Nakanishi |
| 2006/0186825 A1 | 8/2006 | Nakanishi |
| 2007/0247064 A1 | 10/2007 | Hosokawa |
| 2008/0079361 A1 | 4/2008 | Nakanishi |
| 2008/0180421 A1 | 7/2008 | Yudasaka |
| 2009/0206752 A1 | 8/2009 | Nakanishi |
| 2011/0186903 A1 | 8/2011 | Nakanishi |
| 2011/0260167 A1 | 10/2011 | Hosokawa |
| 2012/0119235 A1 | 5/2012 | Nishiyama et al. |

FOREIGN PATENT DOCUMENTS

| | | |
|---|---|---|
| JP | 2002-318556 | 10/2002 |
| JP | 2003-217863 | 7/2003 |
| JP | 2003-282248 | 10/2003 |
| JP | 2005-242383 | 9/2005 |
| JP | 2005-266667 | 9/2005 |
| JP | 2005-338789 | 12/2005 |
| JP | 2009-180854 | 8/2009 |
| WO | 99/10862 | 3/1999 |

* cited by examiner

Aperture ratio 0 %
Resistance value 1.0

Aperture ratio 10 %
Resistance value 1.2

Aperture ratio 9 %
Resistance value 1.9

Aperture ratio 9 %
Resistance value 1.1

DISPLAY PANEL APPARATUS AND METHOD OF FABRICATING DISPLAY PANEL APPARATUS

CROSS REFERENCE TO RELATED APPLICATION(S)

This is a continuation application of PCT Patent Application No. PCT/JP2010/006025 filed on Oct. 8, 2010, designating the United States of America, which is based on and claims priority of Japanese Patent Application No. 2009-238750 filed on Oct. 15, 2009. The entire disclosures of the above-identified applications, including the specifications, drawings and claims are incorporated herein by reference in their entirety.

TECHNICAL FIELD

The present invention relates to display panel apparatuses and methods of fabricating the display panel apparatuses, and particularly relates to an organic electroluminescent (EL) display panel apparatus using organic luminescent material.

BACKGROUND ART

The organic EL display apparatus is a light-emitting display apparatus using electroluminescence of organic compounds, and has been in practical use as a small display apparatus used for mobile phones and others.

The organic EL display apparatus is configured with organic EL devices arranged on a substrate. The organic EL devices can be individually controlled per pixel for light-emission. A typical organic EL display apparatus is manufactured by stacking a driving circuit, an anode, an organic layer, and a cathode on a substrate. The organic layer includes, in addition to an organic EL layer made of an organic compound, at least one of functional layers such as a hole injection layer and an electron transport layer. With this configuration, charge is injected to the organic EL layer from the anode or the cathode through the hole transport layer and others, and the injected charge is recombined in the organic EL layer, and the organic EL layer emits light.

It is important that the operational current sufficient for the organic EL display device in each pixel is supplied in order to achieve high quality in the organic EL display apparatus. This is because lack of sufficient operational current supply decreases luminance, causes unevenness in luminance, and reduction in contrast, which are causes for degraded display quality.

Conventionally, in order to achieve high display quality, a configuration for supplying sufficient operational current to the organic EL device in each pixel of the organic EL display apparatus has been proposed (for example, see Patent Literature 1).

The light-emitting apparatus according to Patent Literature 1 includes a cathode-line connected to the cathode, which is provided outside of an effective region (referred to as display section in this Specification) and surrounding the effective region in which pixels each including a light-emitting device is provided, and the power supply line connected to the pixel electrodes is provided between the cathode-line and the effective region.

According to the light-emitting apparatus with the configuration described above, it is possible to secure sufficient contact area for the cathode-line and the cathode, while suppressing the electric resistance between them to minimum. Accordingly, it is possible to prevent the reduction in the amount of current supplied to the light-emitting device due to a voltage drop caused by the electric resistance.

CITATION LIST

Patent Literature

Patent Literature 1: Japanese Unexamined Patent Application Publication No. 2005-242383
Patent Literature 2: Japanese Unexamined Patent Application Publication No. 2005-338789

SUMMARY OF INVENTION

Technical Problem

In terms of the viewpoint for supplying the sufficient operational current to the organic EL device, it is preferable to provide a larger area for the cathode-line in the light-emitting apparatus according to the conventional technology. However, with the conventional technology, providing the cathode-line in a wide area surrounding the display section may raise a problem that the reliability of the apparatus is reduced since the planarizing film is sealed.

One non-limiting and exemplary embodiment has been conceived in view of the problem, and provides a display panel apparatus including an electrode plate as the line for supplying the operational current for the organic EL device, and with a configuration which is less likely to seal the planarizing film even when the electrode plate is provided in a wide region above the planarizing film, and the method of fabricating the display panel apparatus.

Additional benefits and advantages of the disclosed embodiments will be apparent from the specification and Figures. The benefits and/or advantages may be individually provided by various embodiments and features of the specification and drawings disclosure, and need not all be provided in order to obtain one of more of the same.

Solution to Problem

In one general aspect, the techniques disclosed here feature an aspect of a display panel apparatus including: a substrate; a planarizing film formed on the substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate, in which the electrode plate has a hole exposing a part of a surface of the planarizing film, the hole is a rectangular opening with a longer side parallel with a side of the display section near the hole, and the hole is open along flow of current between the power supply section and a part connecting the auxiliary electrode and the electrode plate.

Advantageous Effects of Invention

The display panel apparatus includes holes for exposing a part of the surface of the planarizing film covering the electrode plate. Thus, the components such as moisture and acid in the planarizing film arranged under the electrode plate can be outgassed in advance through the holes of the electrode plate in the fabrication process of the display panel apparatus (process including a heat treatment such as baking or annealing).

As a result, the defect caused by the trapped gas in the planarizing film due to the electrode plate can be reduced compared to the case in which no hole is provided in the electrode plate.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings.

DETAILED DESCRIPTION

Figure 1:
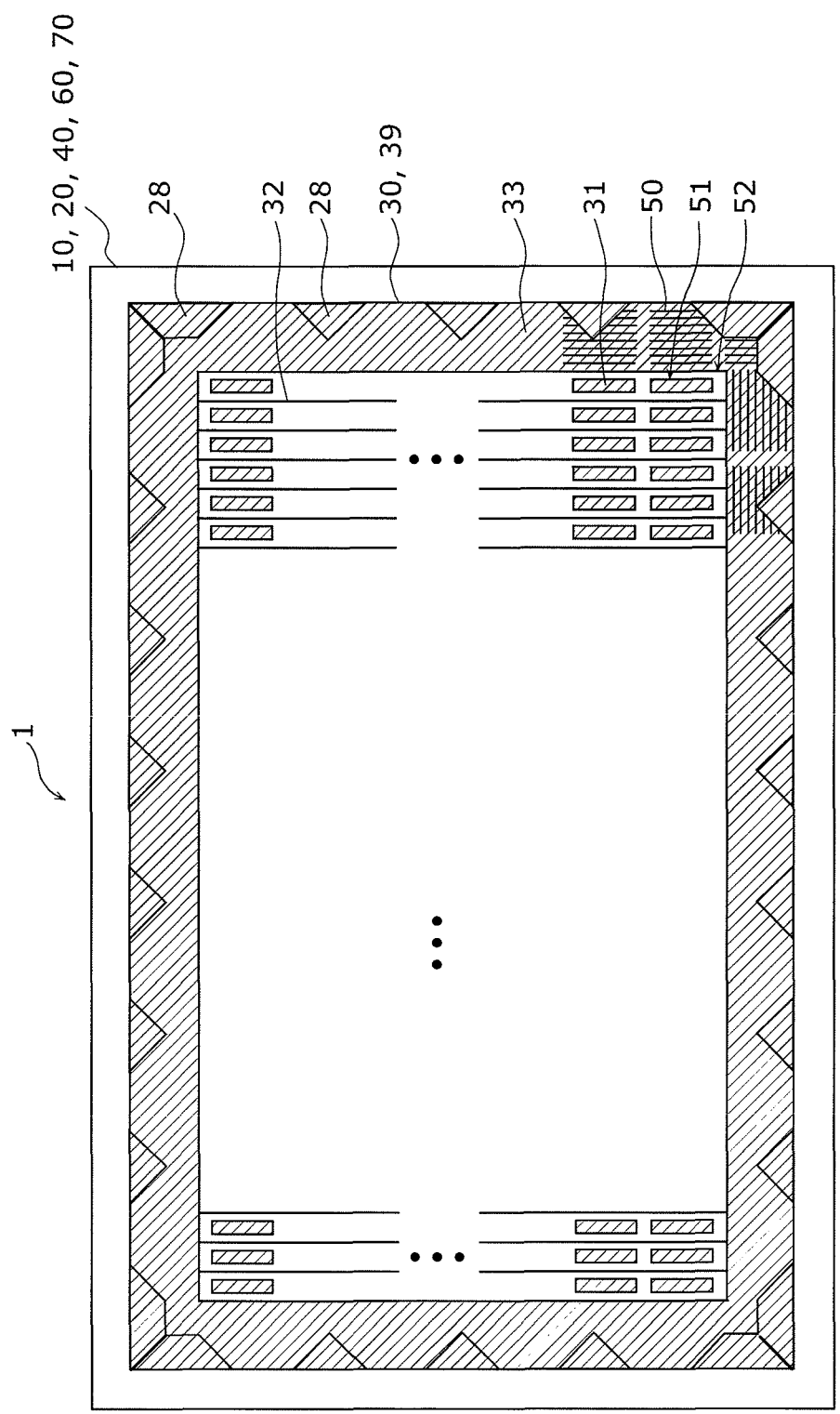
FIG. 1 is a plan view illustrating an example of the configuration of the display panel apparatus according to the embodiment.

Embodiment 1
(Underlying Knowledge of the Present Invention)

The inventors found out that the light-emitting apparatus described on the background art section has the following problem.

In terms of the viewpoint for supplying the sufficient operational current to the organic EL device, larger area of the cathode-line in the light-emitting apparatus according to the conventional technology is preferable. However, providing the cathode-line in a wide area surrounding the display section raises the following problems with the conventional technology.

More specifically, in the fabrication process of the display apparatus, the lower electrode separated for each pixel is generally formed by photo etching after the planarizing film is formed, and the organic layer is subsequently stacked. When forming the planarizing film and the lower electrode, due to cleaning water and chemical solutions such as develop solution and acid, moisture, acid, and other components are absorbed by the planarizing film. Accordingly, if the planarizing film with the moisture and acid absorbed is covered by an electrode plate used for the cathode-line, for example, the planarizing film is sealed with the moisture and acid absorbed inside.

When the organic layer is stacked above the planarizing film in this state, there are cases in which the component such as moisture and acid included in the planarizing film is outgassed to the organic layer. As a result, the organic layer reacts with the occluded gas, degrading the quality of the organic layer and shrinking pixels.

Furthermore, the occluded gas trapped inside the planarizing film peels the electrode plate with the pressure of gas, causing outgassing at a peripheral portion of the display section. As a result, the organic layer at the peripheral portion of the display section reacts with the gas, turning the peripheral portion into white.

Patent Literature 1 fails to suggest an effective solution for overcoming these problems concerned in a case where the electrode plate used as the cathode-line is provided, covering the planarizing film in a wide region surrounding the display section.

Note that, there is a technique in which a passing-through section is formed in an auxiliary conducting layer (cathode line) for outgassing the insulating layer (planarizing film) through the passing-through section, so as to reduce a path for the outgassing (for example, see Patent Literature 2).

However, the conventional technique merely discloses a structure in which the passing-through section is formed with multiple dots or lines, and fails to consider that the passing-through section interrupts the flow of drive current in the auxiliary conductive layer.

Accordingly, merely forming the passing-through section in the auxiliary conductive layer would make the passing-through section itself become resistance to the flow of the drive current.

In order to solve the problems described above, an aspect of the display panel apparatus according to the present disclosure includes a substrate; a planarizing film formed on the substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate, in which the electrode plate has a hole exposing a part of a surface of the planarizing film, the hole is a rectangular opening with a longer side parallel with a side of the display section near the hole, and the hole is open along flow of current between the power supply section and a part connecting the auxiliary electrode and the electrode plate.

According to this aspect, the hole exposing the part of the surface of the planarizing film is provided in the electrode plate covering the planarizing film. With this, even if the planarizing film in which components such as moisture or acid is absorbed is covered with the electrode plate, the planarizing film is outgassed through the holes.

Accordingly, if the pixels are stacked on the planarizing film in this state, the component such as moisture or acid included in the planarizing film is outgassed to the organic layer, preventing the degradation in the quality of the organic layer due to the reaction of the organic layer with the gas. This prevents the pixels from being shrunk.

Furthermore, the component such as moisture and acid trapped in the planarizing film is released, thereby preventing the electrode plate from peeled off by pressure of a gas made of the component. Accordingly, it is possible to prevent the occluded gas from outgassing to the organic layer at the peripheral portion of the display section. Accordingly, it is possible to prevent the organic layer from reacting with the gas, and from turning the peripheral section turning into white.

Furthermore, the hole is open in a rectangular shape having a longer side parallel with a side of the display section near the hole. The hole is open along the flow of current between the power supply section and the connecting part of the auxiliary electrode and the electrode plate. With this, the rectangular shape of the opening of the hole is approximated to the direction of current flow. Thus, it is possible to suppress the resistance of the current by the opening of the hole, suppressing the change in a resistance value.

In an aspect of the display panel apparatus according to the present disclosure, the organic layer is formed in a region partitioned by banks which partition the pixels, the lower electrode is formed between the organic layer and the planarizing film, the auxiliary electrode is formed with a predetermined interval from the lower electrode, outside of a region in which the lower electrode is formed; and the hole is an opening having a width corresponding to the predetermined interval between the lower electrode and the auxiliary electrode.

According to this aspect, the holes are open in the electrode plate in a region other than the display section in a width corresponding to the predetermined interval which is the interval between the lower electrode and the auxiliary electrode in the display section. With this, the planarizing film can be outgassed through the hole in a level substantially identical in the display section and outside the display section. With this, it is possible to prevent the component such as moisture or acid from trapped excessively in the planarizing film in the region other than the display section.

As a result, it is possible to prevent the quality of the organic layer from degrading due to the reaction of the organic layer with the gas. The degradation in the quality of the organic layer occurs since the planarizing film is excessively sealed in a region other than the display section, causing components such as moisture or acid remaining in the planarizing film in the region other than the display section, subsequently resulting in outgassing of the component such as moisture and acid included in the planarizing film to the organic layer.

In an aspect of the display panel apparatus according to the present disclosure, the power supply section has a shape of trapezoid having an upper base facing the display section, and receives current flowing along the hole from the display section at legs of the trapezoid.

According to this aspect, the power supply section may have a trapezoid shape with the upper base facing toward the display section. With this, it is possible to receive the current using the legs of the trapezoid without increasing the area of the power supply section. Accordingly, it is possible to maintain the area of the power supply section relatively small, allowing effective current supply. In an aspect of the display panel apparatus according to the present disclosure, the power supply section has a shape of triangle having a vertex pointed toward the display section, and receives current flowing along the hole from the display section at sides of the triangle, which meet at the vertex.

According to this aspect, the power supply section may have a triangular shape with a vertex pointed toward the display section. With this, it is possible to receive the current using the sides of the triangle without increasing the area of the power supply unit. Accordingly, it is possible to maintain the area of the power supply section relatively small, allowing effective current supply.

In an aspect of the display panel apparatus according to the present disclosure, a substrate; a planarizing film formed on the substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate are included, in which the electrode plate has a hole exposing a part of a surface of the planarizing film, the power supply section has a shape of triangle having a vertex pointed toward the display section, among a plurality of the holes, a predetermined hole provided between a side of the triangle and the display section has a rectangular opening with a longer side parallel with a side of the display section near the predetermined hole, and the predetermined hole is open along flow of current between the power supply section and a part connecting the auxiliary electrode and the electrode plate.

According to this aspect, the power supply section is triangular in shape having the vertex pointed toward the display section, and each of the predetermined holes provided between the sides of the triangle and the display section, among the holes, is a rectangular opening having a longer side parallel with a side of the display section near the predetermined holes. With this, the holes are open along the flow of the current between the power supply section and the connecting part of the auxiliary electrode and the electrode plate. Accordingly, the rectangular shape of the opening of the hole is approximated to the flow of current. Thus, it is possible to prevent the opening of the hole from becoming the resistance on the flow, which suppresses the change in the resistance value.

In an aspect of the display panel apparatus according to the present disclosure, a substrate; a planarizing film formed on the substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate are included, in which the electrode plate has a hole exposing a part of a surface of the planarizing film, the power supply section has a shape of trapezoid having an upper base facing the display section, among a plurality of the holes, a predetermined hole provided between the upper base of the trapezoid and the display section has a rectangular opening with a shorter side parallel with a side of the display section near the predetermined hole, and the predetermined hole is open along flow of current between the power supply section and a part connecting the auxiliary electrode and the electrode plate.

According to this aspect, the power supply section is trapezoidal in shape, having the upper base facing the display section. The predetermined holes provided between the upper base of the trapezoid and the display section, among the holes, each is an opening having a shorter side parallel with the side of the display section near the predetermined holes. With this, the holes are open along the flow of the current between the power supply section and the connecting part of the auxiliary electrode and the electrode plate. Accordingly, the rectangular shape of the opening of the hole is approximated to the flow of current. Thus, it is possible to prevent the opening of the hole from becoming the resistance on the flow, which suppresses the change in the resistance value.

In an aspect of the display panel apparatus according to the present disclosure, a substrate; a planarizing film formed on the substrate; a pixel formed on the planarizing film and including: a lower electrode; an organic layer; and an upper electrode; an auxiliary electrode electrically insulated from the lower electrode and electrically connected to the upper electrode; a display section including a plurality of the pixels; an electrode plate electrically connected to the auxiliary electrode and arranged to cover the planarizing film outside the display section; and a power supply section electrically connected to the electrode plate are included, in which the electrode plate has a hole exposing a part of a surface of the planarizing film, the power supply section has a shape of trapezoid having an upper base facing the display section, among a plurality of the holes, a predetermined hole provided between a leg of the trapezoid and the display section has a rectangular opening with a longer side parallel with a side of the display section near the predetermined hole, and the predetermined hole is open along flow of current between the power supply section and a part connecting the auxiliary electrode and the electrode plate.

According to this aspect, the power supply section is trapezoidal in shape having the upper base facing the display section. Among the holes, the predetermined holes provided between the leg of the trapezoid and the display section each is a rectangular opening having a longer side parallel with the side of the display section near the predetermined holes. With this, the holes are open along the flow of the current between the power supply section and the connecting part of the auxiliary electrode and the electrode plate. Accordingly, the rectangular shape of the opening of the hole is approximated to the flow of current. Thus, it is possible to prevent the opening of the hole from becoming the resistance on the flow, which suppresses the change in the resistance value.

In an aspect of the display panel apparatus according to the present disclosure, the organic layer is formed in a region partitioned by banks which partition the pixels, the banks are formed in a predetermined direction in the display section, and the auxiliary electrode is formed in the predetermined direction, outside of a region in which the lower electrode is formed.

According to this aspect, the auxiliary electrode may be provided along the predetermined direction in the display section outside of the region in which the lower electrode is formed.

In an aspect of the display panel apparatus according to the present disclosure, the organic layer is formed in a region partitioned by banks which partition the pixels, the banks are formed in a predetermined direction in the display section, and the auxiliary electrode is formed in a direction perpendicular to the predetermined direction, outside of a region in which the lower electrode is formed.

According to this aspect, the auxiliary electrode may be provided in a direction perpendicular to the predetermined direction in the display section outside of the region in which the lower electrode is formed.

In an aspect of the display panel apparatus according to the present disclosure, the organic layer is formed in a region partitioned by banks which partition the pixels, the banks are formed parallel with each other in a predetermined direction in the display section, and the auxiliary electrode is formed in the predetermined direction and a direction perpendicular to the predetermined direction, outside of a region in which the lower electrode is formed.

According to this aspect, the auxiliary electrode may be provided in a direction crossing the predetermined direction in the display section outside of the region in which the lower electrode is formed.

In an aspect of the display panel apparatus according to the present disclosure, the organic layer is formed in a region partitioned by banks which partition the pixels, the banks are formed in the display section in a row direction along the pixels and a column direction along the pixels, and the auxiliary electrode is formed, in the row direction or the column direction, outside of a region in which the lower electrode is formed.

According to this aspect, the auxiliary electrode may be provided in the row direction or the column direction in the display section outside of the region in which the lower electrode is formed.

In an aspect of the display panel apparatus according to the present disclosure, the lower electrode is formed below the organic layer and on an upper surface of the planarizing film, and the auxiliary electrode is provided in a same layer as the lower electrode and on the upper surface of the planarizing film.

According to this aspect, the auxiliary electrode may be provided on an upper surface of the planarizing film in the same layer as the lower electrode.

In an aspect of the display panel apparatus according to the present disclosure, the auxiliary electrode is provided above or below the lower electrode.

According to this aspect, the auxiliary electrode may be provided above or below the lower electrode.

In an aspect of the display panel apparatus according to the present disclosure, an insulating film provided between the organic layer and the planarizing film is further included, in which the lower electrode is formed below the organic layer and on an upper surface of the insulating film, and the auxiliary electrode is formed below the lower electrode and on an upper surface of the planarizing film.

According to this aspect, the auxiliary electrode is formed below the lower electrode.

In an aspect of the display panel apparatus according to the present disclosure, the organic layer includes an organic EL layer containing an organic luminescent material.

According to this aspect, an organic EL layer contains an organic luminescent material.

In an aspect of the display panel apparatus according to the present disclosure, the upper electrode is a cathode, the lower electrode is an anode, and the organic layer includes one of a hole injection layer which injects holes from the lower electrode to the organic EL layer and an electron transport layer which transports electrons from the upper electrode to the organic EL layer.

According to this aspect, the organic layer may include the hole injection layer which injects holes from the lower electrode to the organic EL layer, or the electron transport layer which transport electrons from the upper electrode to the organic EL layer.

In an aspect of the display panel apparatus according to the present disclosure, a TFT layer having a driver element which drives the pixel is included, and the TFT layer is provided between the substrate and the planarizing film.

In an aspect of the display panel apparatus according to the present disclosure, the display panel apparatus is included, in which the pixels in the display panel apparatus are disposed in a matrix.

According to this aspect, the display panel apparatus may be used as the display apparatus.

In an aspect of the method of fabricating display panel apparatus according to the present disclosure, a method of fabricating a display panel apparatus includes: a first process of forming a TFT layer including a driver element which causes an organic EL layer containing an organic luminescent material to emit light; a second process of forming a planarizing film which planarizes an upper surface of the TFT layer; a third process of forming a lower electrode in a display section of a display panel above the planarizing film, an electrode plate in a region around the display section of the display panel above the planarizing film, and an auxiliary electrode outside of a region in which the lower electrode is formed in the display section of the display panel above the planarizing film, the auxiliary electrode being electrically insulated from the lower electrode and electrically connected to the electrode plate; a fourth process of forming, above the lower electrode, banks for partitioning pixels; a fifth process of forming the organic EL layer in regions partitioned by the banks; and a sixth process of forming, above the organic EL layer, an upper electrode for causing the organic layer to emit light by a current supply to and from the lower electrode, the upper electrode being electrically connected to the auxiliary electrode, in which the electrode plate has a hole exposing a part of a surface of the planarizing film, in at least one of the third process and the fourth process, the planarizing film is outgassed through the holes of the electrode plate, the electrode plate has a power supply section which receives current through the electrode plate, and the hole is a rectangular opening with a longer side parallel with a side of the display section near the hole, and the hole is open along flow of current between the power supply section and a part connecting the auxiliary electrode and the electrode plate.

According to this aspect, the hole exposing the part of the surface of the planarizing film is provided in the electrode plate covering the planarizing film. Subsequently, the planarizing film is outgassed through the hole in the electrode plate. After that, the electrode plate is covered with the upper electrode, electrically connecting the auxiliary electrode and the upper electrode.

With this, even if the planarizing film in which components such as moisture or acid is absorbed is covered with the electrode plate, the planarizing film is outgassed through the holes. Accordingly, if the pixels are stacked on the planarizing film in this state, the component such as moisture or acid included in the planarizing film is outgassed to the organic layer, preventing the degradation in the quality of the organic layer due to the reaction of the organic layer with the gas. This prevents the pixels from being shrunk.

Furthermore, the component such as moisture and acid trapped in the planarizing film is released, thereby preventing the electrode plate from peeled off by pressure of a gas made of the component. Accordingly, it is possible to prevent the occluded gas from outgassing to the organic layer at the peripheral portion of the display section. Accordingly, it is possible to prevent the organic layer from reacting with the gas, and from turning the peripheral section turning into white.

In an aspect of the method of fabricating display panel apparatus according to the present disclosure, at least one of the third process and the fourth process includes a heat treatment, and with the heat treatment in the at least one of the third process and the fourth process, the planarizing film is outgassed through the hole of the electrode plate.

According to this aspect, the planarizing film may be outgassed through the holes of the electrode plate using the heat generated by the heat treatment in at least one of the third process and the fourth process.

In an aspect of the method of fabricating display panel apparatus according to the present disclosure, the heat treatment in the third process is annealing the lower electrode, the electrode plate, and the auxiliary electrode.

According to this aspect, in the third process, the planarizing film may be outgassed though the hole in the electrode plate, using the heat generated by the heat treatment for annealing the lower electrode, the electrode plate, and the auxiliary electrode.

In an aspect of the method of fabricating display panel apparatus according to the present disclosure, the heat treatment in the fourth process is annealing the banks.

According to this aspect, in the fourth process, the planarizing film may be outgassed though the hole in the electrode plate, using the heat generated by the heat treatment for annealing the banks.

In an aspect of the method of fabricating display panel apparatus according to the present disclosure, a seventh process of forming a pixel regulating layer for partitioning the pixels above the lower electrode, the electrode plate, and the auxiliary electrode is included, and the seventh process being performed between the third process and the fourth process.

According to this aspect, the pixels may be partitioned using the pixel regulating layer.

In an aspect of the method of fabricating display panel apparatus according to the present disclosure, the upper electrode is a cathode, the lower electrode is an anode, and the method of fabricating the display panel apparatus further includes an eighth process of forming, between the lower electrode and the organic EL layer, a hole injection layer which injects holes from the lower electrode to the organic EL layer, the eighth process being performed between the seventh process and the fourth process, in which the eighth process includes a heat treatment, and with the heat treatment, the planarizing film is outgassed through the hole in the electrode plate.

In an aspect of the method of fabricating display panel apparatus according to the present disclosure, the heat treatment in the eighth process is annealing the hole injection layer.

According to this aspect, using the heat generated at the heat treatment in the eighth process for annealing the hole injection layer, the planarizing film may be outgassed through the holes in the electrode plate.

In an aspect of the method of fabricating display panel apparatus according to the present disclosure, the upper electrode is a cathode, the lower electrode is an anode, and the method of fabricating the display panel apparatus further includes a ninth process of forming, between the upper electrode and the organic EL layer, an electron transport layer which transport electrons from the upper electrode to the organic EL layer, the ninth process being performed between the fifth process and the sixth process.

According to this aspect, the light-emitting capacity of the display panel apparatus may be improved using the electron transport layer.

The following shall describe the display panel apparatus according to Embodiments of the present invention in detail with reference to the drawings.

Note that, in the description of the embodiment, an example in which an active-matrix organic EL display panel apparatus is used is described as a typical example. However, the display panel apparatus according to the present invention is not limited to the organic EL display panel apparatus, but is widely applicable to a display panel apparatus having a display section which includes arranged pixels which can be individually controlled for light-emission, and an electrode plate as a line for supplying operational current of the pixels arranged in the display section.

(Overview of the Display Panel Apparatus)

FIG. 1 is a plan view illustrating an example of the configuration of the display panel apparatus 1 according to the embodiment of the present invention. Note that, FIG. 1 is a schematic diagram for description, and the ratio of the sections is not precise. The stacked structure of the display panel apparatus 1 which is roughly described in the following description shall be described in detail later with reference to FIGS. 4 to 7.

As illustrated in FIG. 1, the display panel apparatus 1 is configured with a stacked structure including a TFT layer 20 and a planarizing film 30 stacked on a substrate 10 in this order, a display section 52 provided thereon with the arranged pixels 51 which can be individually controlled for light emission, and a sealing film 40, a resin layer 60, and a glass substrate 70 sealing the entire surface.

In the display section 52, an organic EL device including a lower electrode 31 separated for each pixel 51, an upper electrode 39 provided on the entire surface, and an organic layer having an electroluminescent property, interposed between the lower electrode 31 and the upper electrode 39. The organic layer is a stacked structure of the hole injection layer that are made of organic material or inorganic material, the organic EL layer, and an electron transport layer, for example.

The auxiliary electrode 32 and the electrode plate 33 are lines for causing a flow of current in the organic EL device in the pixels 51. The upper electrode 39 is connected to the auxiliary electrode 32 in the display section 52, and is connected to the electrode plate 33 outside of the display section 52. The auxiliary electrode 32 is connected to the electrode plate 33, and the electrode plate 33 is connected to a power supply section 28. The lower electrode 31 is connected to the driver element provided in the TFT layer 20. In order to facilitate understanding, the area in which the lower electrode 31, the auxiliary electrode 32, and the electrode plate 33 are provided is indicated by hatching.

In each pixel 51, the organic layer emits light by the operational current supplied from the driver element through the lower electrode 31 and flowing from the upper electrode 39 to the power supply section 28 through the electrode plate 33.

The electrode plate 33 is formed to cover the planarizing film 30 outside of the display section 52, and includes holes 50 for the outgassing from the planarizing film 30.

In the display panel apparatus 1 with the configuration described above, the electrode plate 33 connected to the upper electrode 39 is provided in a wide area outside of the display section 52. Accordingly, it is possible to suppress the electric resistance from the pixels 51 to the power supply section 28 at a low value. In addition, since the holes 50 are provided in the electrode plate 33, the gas that should be released at the time of outgassing is less likely to be sealed in the planarizing film.

As a result, the reduction in luminance, unevenness in luminance, and reduction in contrast all caused by the insufficient supply of the operational current are eased, increasing the display quality. In addition, the defect caused by the gas that should be released at the time of outgassing trapped in the planarizing film 30 is reduced.

Figure 2:
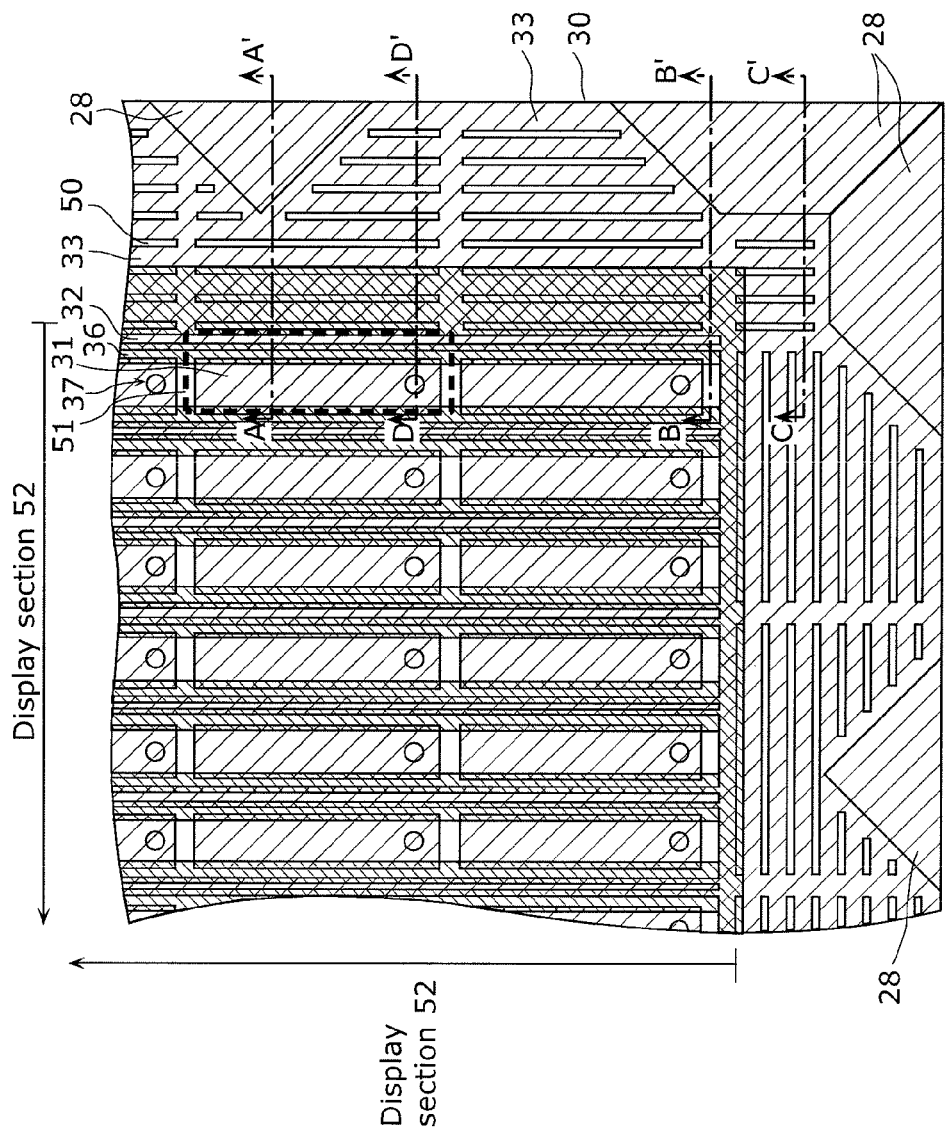
FIG. 2 is an enlarged plan view illustrating an example of the configuration of the display panel apparatus according to the embodiment.

FIG. 2 is an enlarged planar view illustrating details configuration the display panel apparatus 1 illustrated in FIG. 1 at the lower right corner.

As illustrated in FIG. 2, the power supply section 28 provided at a side of the electrode plate 33 is a triangle with a vertex pointed to the display section 52, for example. In addition, the power supply section 28 provided at a corner of the electrode plate 33 is a trapezoid with an upper base which is a shorter side of a pair of parallel sides, arranged closer to the display section 52, for example. The power supply section 28 is a conductive film, for example, and is connected to the electrode plate 33 in the triangular or trapezoidal regions in FIG. 2, and may be extended to outside of the diagram. To put it differently, the shape of the power supply section in this Specification is defined as the shape of the region in which the electrode plate 33 and the power supply section 28 are connected.

The bank 36 is provided along the vertical direction of the diagram. The auxiliary electrode 32 is provided in a region in which the lower electrode 31 is not formed, in a direction parallel with the bank 36. The organic EL layer 37 is arranged in a belt-shaped region partitioned by the adjacent banks 36.

In the configuration illustrated in FIG. 2, for each belt-shaped region partitioned by the banks 36, the organic EL layer 37 which emits light in red, blue, or green is provided so as to configure a color display panel apparatus. In this case, each pixel 51 corresponds to a sub pixel, and composes one pixel by three adjacent pixels 51 each of which emits light in red, blue, or green. Note that, to be described later, the adjacent pixels 51 may be partitioned by providing a pixel regulating layer made of an insulating material between the adjacent lower electrodes 31 in a belt-shaped region partitioned by the banks 36.

In the electrode plate 33, long rectangle holes 50 are provided along the direction of the operational current for each pixel 51 flowing in the electrode plate 33. Each of the holes 50 is elongated in a direction parallel with a side of the display section 52 adjacent to the hole 50. In order to facilitate the understanding, in FIG. 2, the area in which the lower electrode 31, the auxiliary electrode 32, and the electrode plate 33 are provided is illustrated in the right-downward hatching, and the area in which the bank 36 is formed is illustrated in the right-upward hatching.

The lower electrode 31 and the auxiliary electrode 32 are provided with the predetermined interval, and the hole 50 is open in a width corresponding to the interval between the lower electrode 31 and the auxiliary electrode 32. The width of the hole 50 may be, for example, the same as an interval between the lower electrode 31 and the auxiliary electrode 32.

Figure 3:
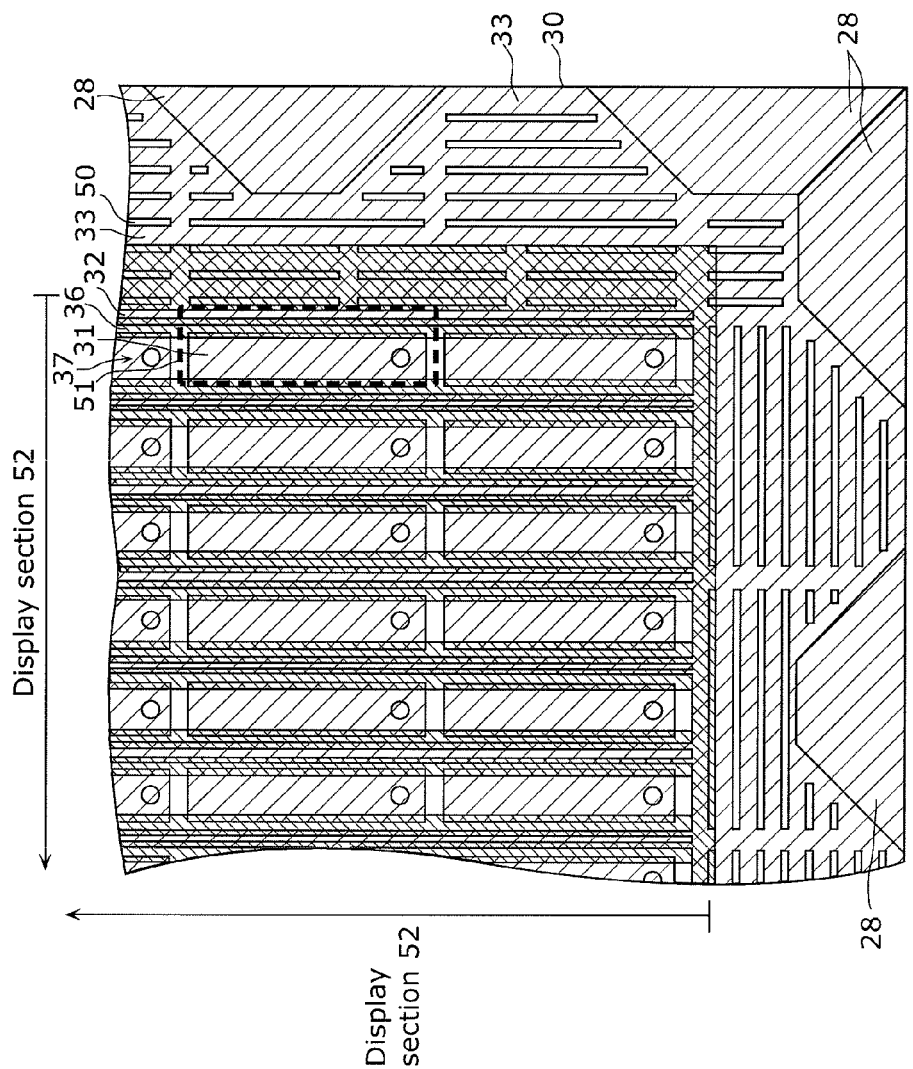
FIG. 3 is an enlarged plan view illustrating an example of the configuration of the display panel apparatus according to the embodiment.

As illustrated in FIG. 3, the power supply section 28 provided at the sides of the electrode plate 33 may be a trapezoid with the upper base facing the display section 52.

(Detailed Configuration of Display Panel Apparatus)

The following shall describe detailed configuration of the display panel apparatus 1 with reference to FIGS. 4 to 7.

Note that, FIGS. 4 to 7 are schematic diagrams for description, and thickness, ratios of the sizes of components, and the number of the components repeatedly arranged is not strictly accurate. Furthermore, the configuration of the display panel apparatus 1 illustrated in FIGS. 4 to 7 is a representative example, and the display panel apparatus 1 is not limited to this example. The same reference numerals are assigned to the components described in FIG. 1, and the description for these components is omitted where appropriate.

Figure 4:
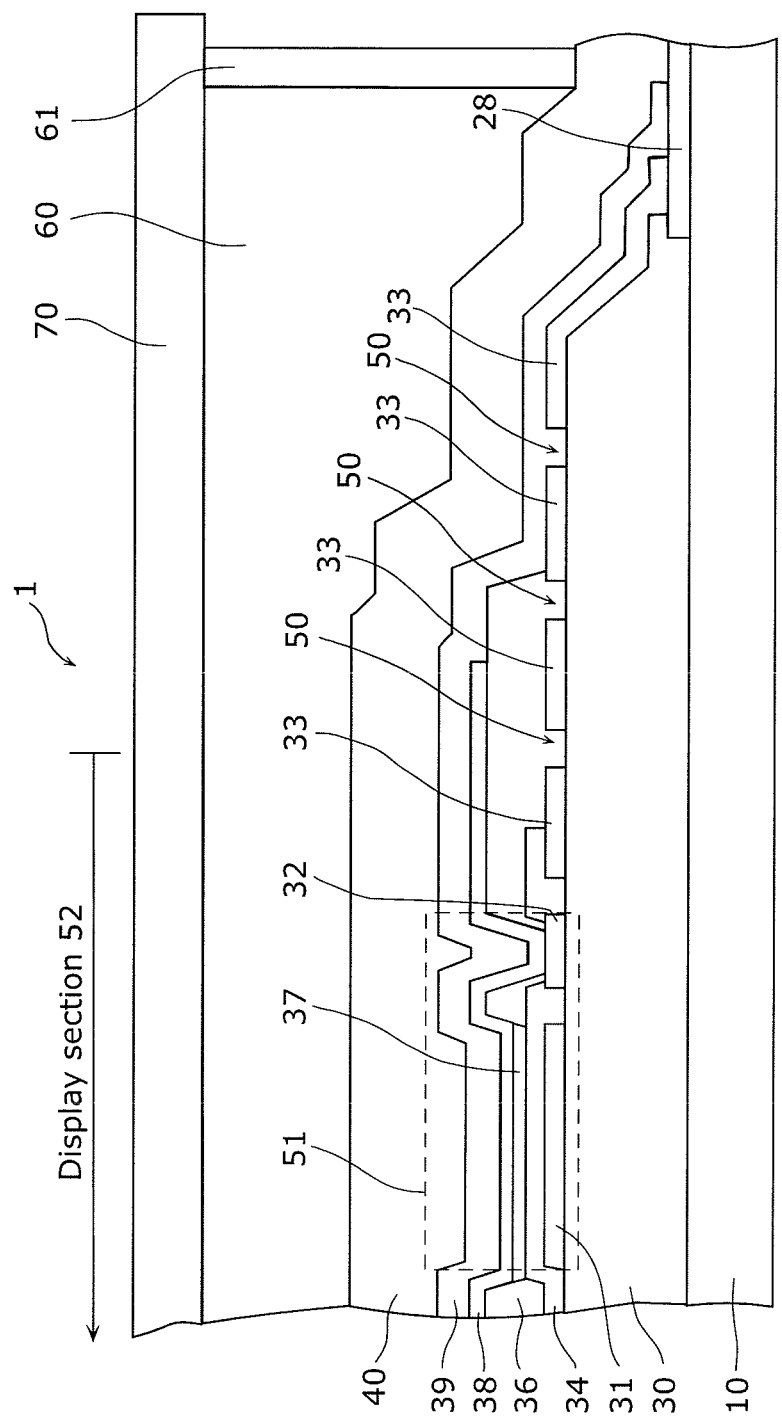
FIG. 4 is an AA' cross-sectional view illustrating an example of the configuration of the display panel apparatus according to the embodiment.

FIG. 4 is a cross-sectional view illustrating a cross-sectional surface of the display panel apparatus 1 along the line AA' in FIG. 2. As illustrated in FIG. 4, in the AA' cross-section in FIG. 2, above the upper surface of the substrate 10, the planarizing film 30 for planarizing the upper surface of a TFT layer 20 to be described later, the lower electrodes 31 each separately provided for a pixel 51 and used as an anode, the auxiliary electrode 32 electrically isolated from the lower electrode 31, the electrode plate 33 electrically connected to the auxiliary electrode 32, a hole injection layer 34 made of an organic material or inorganic material having hole transporting property, the bank 36 made of photosensitive resin, the organic EL layer 37 made of an organic material having electroluminescent property, an electron transport layer 38 made of an organic material having electron transporting property, the upper electrode 39 made of a conductive material and is used as the cathode, and a sealing film 40 made of an insulating material.

Note that, the auxiliary electrode 32 is electrically isolated from the lower electrode 31 by forming the lower electrode 31 and the auxiliary electrode 32 electrically isolated from each other in the same layer through patterning one conductive film.

The glass substrate 70 is provided above the sealing film 40 via the sealing member 61, and the gap between the sealing film 40 and the glass substrate is filled with a resin layer 60.

The electrode plate 33 is formed to cover the planarizing film 30 outside of the display section 52, and includes holes 50 for exposing part of the surface of the planarizing film 30. The electrode plate 33 is provided outside of the display section 52, and is electrically connected to the power supply section 28 in a region in which the planarizing film 30 is not provided. The electrode plate 33 is electrically connected to the upper electrode 39 in a region in which the banks 36 are not provided, outside of the display section 52.

As described above, the holes 50 are open in a width corresponding to the interval between the lower electrode 31 and the auxiliary electrode 32 (for example, in the width identical to the interval). With this configuration, in the fabrication process of the display panel apparatus 1, the gas included in the planarizing film 30 can be released through the holes 50 approximately in the same level inside the display section 52 and outside the display section 52. For this reason, it is possible to prevent the excess moisture and acid sealed in the planarizing film 30 in a region other than the display section 52.

Figure 5:
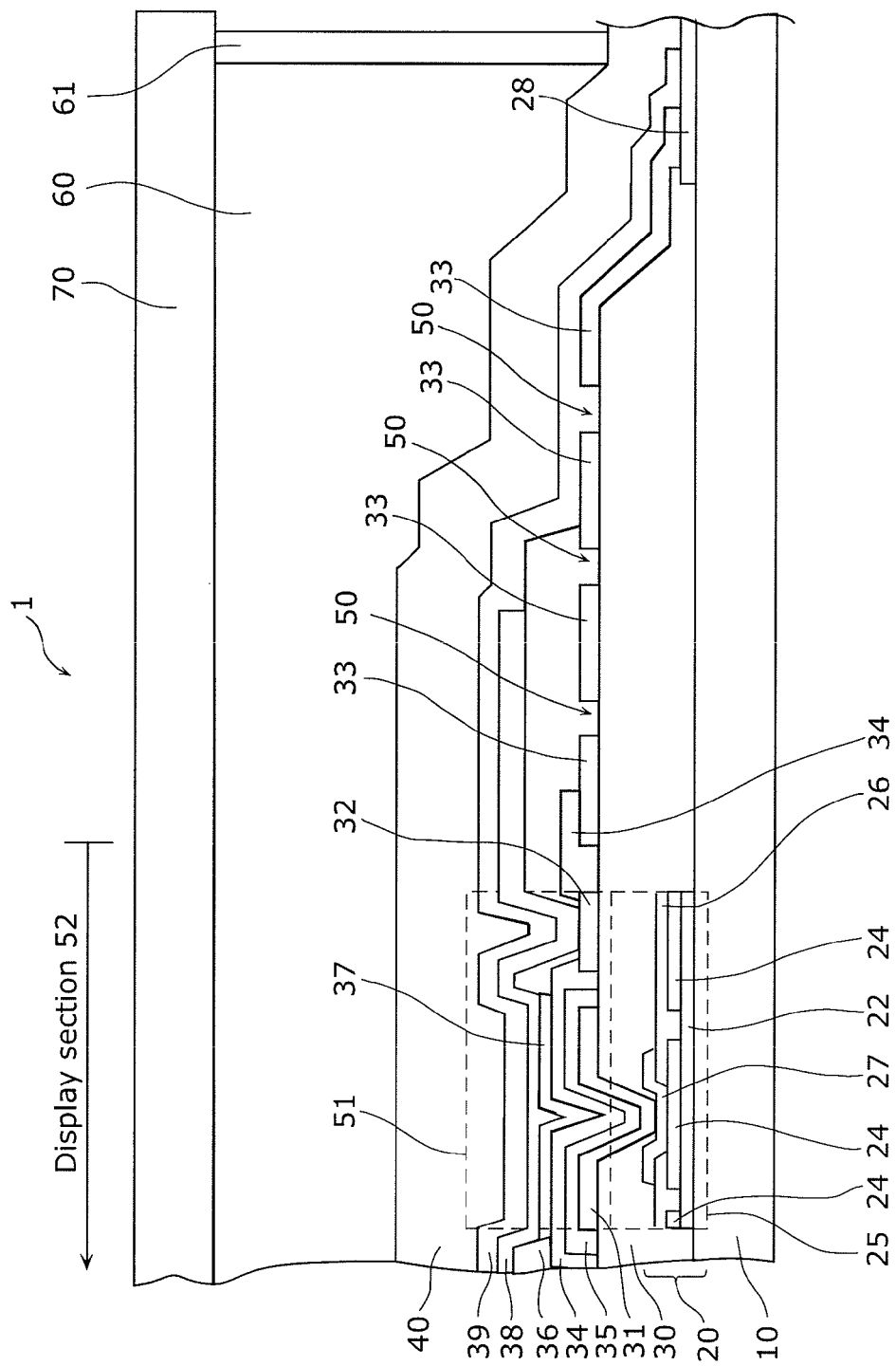
FIG. 5 is a DD' cross-sectional view illustrating an example of the configuration of the display panel apparatus according to the embodiment.

FIG. 5 is a cross-sectional view illustrating a cross-sectional surface of the display panel apparatus 1 along the line DD' in FIG. 2. As illustrated in FIG. 5, in DD' cross-section in FIG. 2, the driver element 25 which is a thin-film transistor including the gate insulating film 22 and the source-drain electrode 24, an interlayer insulating film 26, and an Indium Tin Oxide (ITO) film 27 are provided above the substrate 10. Note that, although not illustrated in the cross-section of FIG. 5, the driver element 25 includes other configuration generally necessary as thin-film transistor such as a gate electrode and a semiconductor film in a separate cross-section. The driver element 25 forms a driver circuit with a selector element which is another thin-film transistor and a capacitor for holding luminance voltage that are not illustrated. A region in which the driver circuit is provided between the substrate 10 and the planarizing film 30 is referred to as a TFT layer 20.

The planarizing film 30 for planarizing the upper surface of the TFT layer 20 is provided between the pixel 51 and the TFT layer 20.

The lower electrode 31 is electrically connected to the source-drain electrode 24 in the driver element 25 through the contact hole provided through the planarizing film 30 and the interlayer insulating film 26. Furthermore, in a region in the display section 52 and in which the bank 36 is not provided; the upper electrode 39 is electrically connected to the auxiliary electrode 32 through the electron transport layer 38.

The electrode plate 33 is formed to cover the planarizing film 30 outside of the display section 52, and includes holes 50 for exposing part of the surface of the planarizing film 30. The electrode plate 33 is provided outside of the display section 52, and is electrically connected to the power supply section 28 in a region in which the planarizing film 30 is not provided. The electrode plate 33 is electrically connected to the upper electrode 39 in a region in which the banks 36 are not provided outside of the display section 52.

A pixel regulating layer 35 may be provided between the lower electrode 31 and the hole injection layer 34. The pixel regulating layer 35 is made of insulating material, and regulates the light-emitting region by covering undesired portion of the lower electrode 31. For example, the pixel regulating layer 35 covers inside of the contact hole and the lower electrode 31 nearby. With this, the pixel regulating layer 35 prevents the light emission at the contact hole in which the thickness of the organic EL layer 37 is difficult to control and the light-emission tends to be unstable. Furthermore, by covering the lower electrodes 31 adjacent in the belt-shaped region partitioned by the bank 36 illustrated in FIGS. 2 and 3 with the pixel regulating layer 35, the adjacent pixels 51 can be partitioned.

Figure 6:
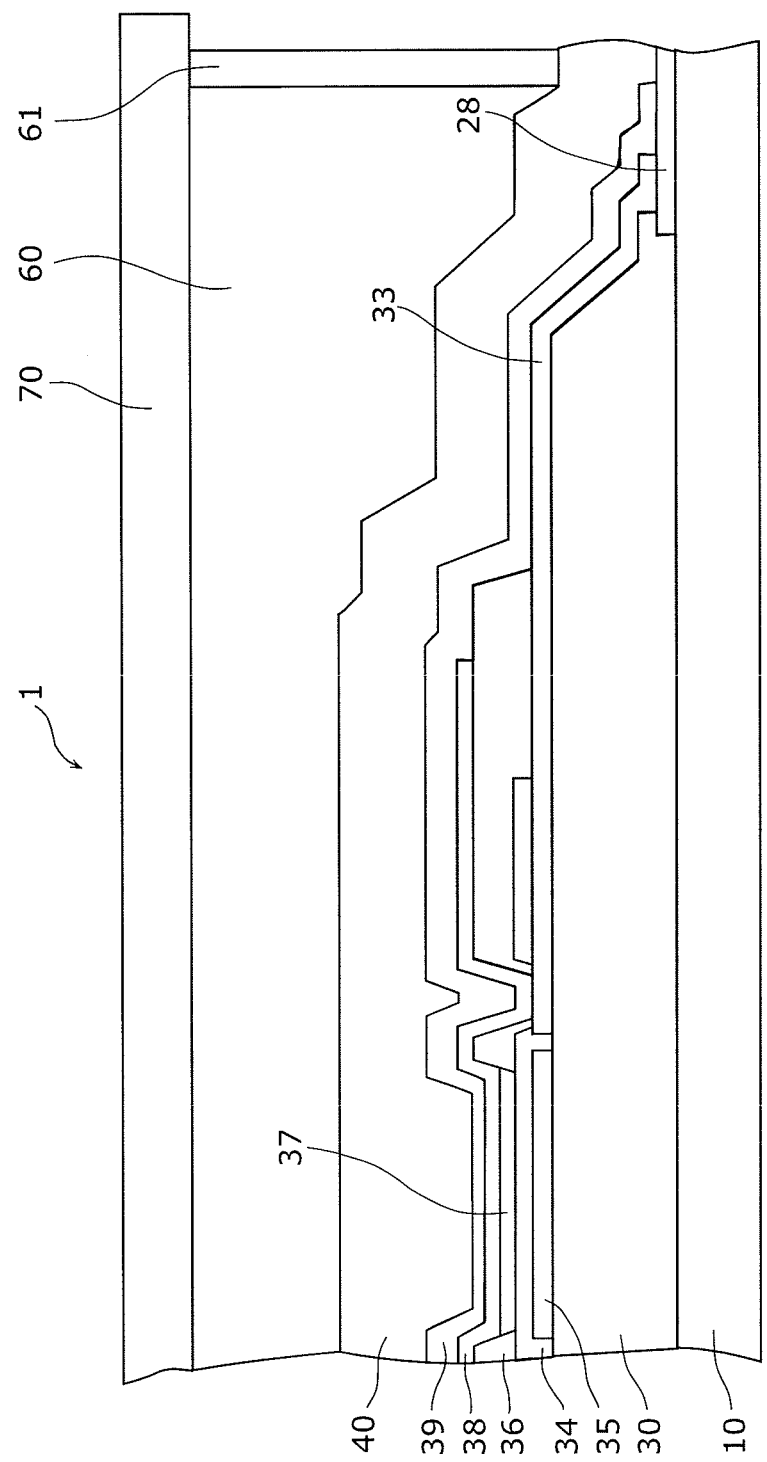
FIG. 6 is a BB' cross-sectional view illustrating an example of the configuration of the display panel apparatus according to the embodiment.

FIG. 6 is a cross-sectional view illustrating a cross-sectional surface of the display panel apparatus 1 along the line BB' in FIG. 2. As illustrated in FIG. 6, in the BB' cross-section in FIG. 2, and, the lower electrode 31 and the holes in the electrode plate 33 do not appear in the cross-section at the end portion of the pixel 51.

Figure 7:
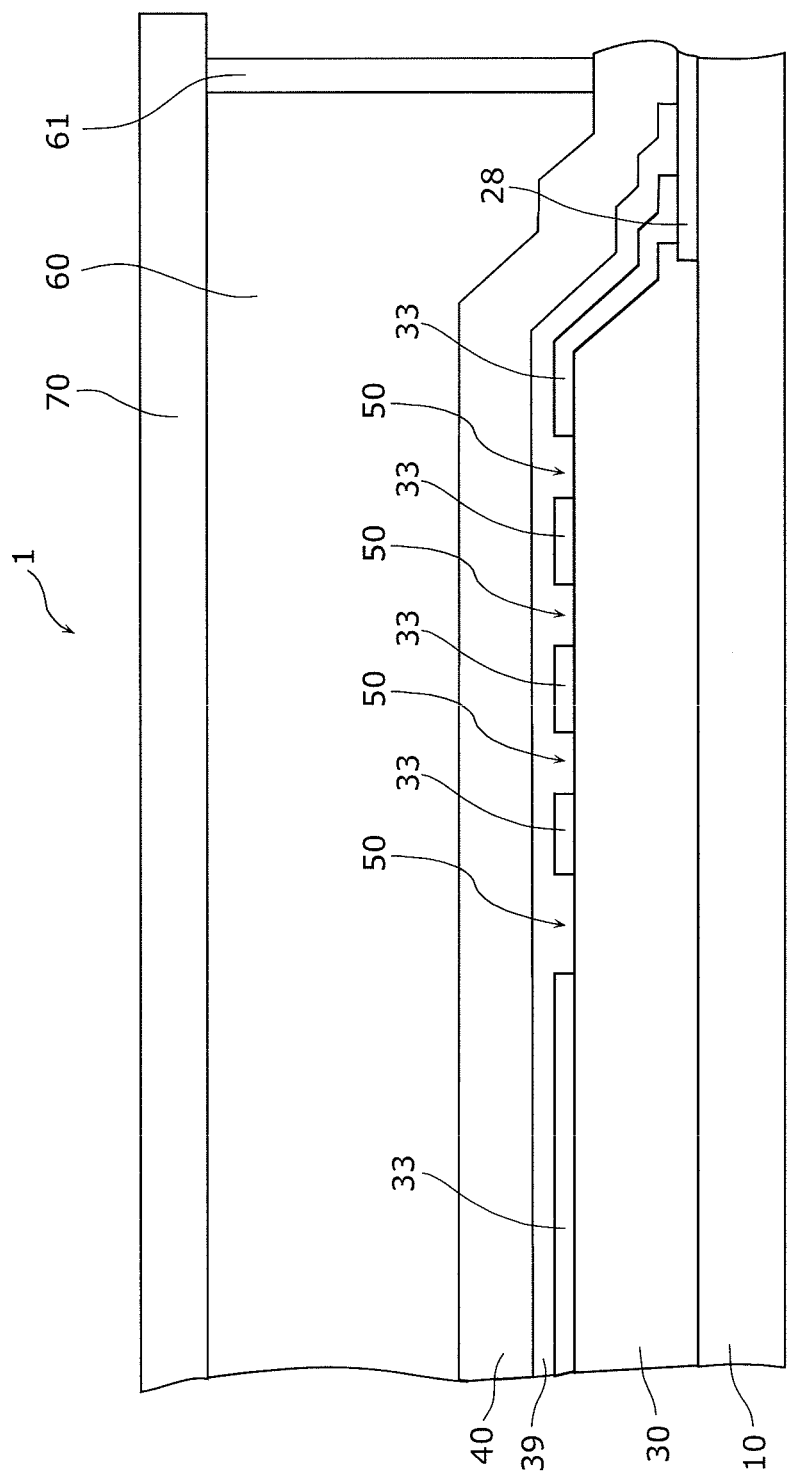
FIG. 7 is a CC' cross-sectional view illustrating an example of the configuration of the display panel apparatus according to the embodiment.

FIG. 7 is a cross-sectional view illustrating a cross-sectional surface of the display panel apparatus 1 along the line CC' in FIG. 2. As illustrated in FIG. 7, in the CC' cross-section in FIG. 2, the lower electrode 31, the auxiliary electrode 32, the hole injection layer 34, the organic EL layer 37, and the electron transport layer 38 do not appear in the cross-section outside of the display section 52.

According to this aspect, holes 50 exposing part of the surface of the planarizing film 30 are provided in the electrode plate 33 covering the planarizing film 30. With this, even if the planarizing film 30 with the components such as moisture and acid absorbed inside is covered with the electrode plate 33, the components such as moisture and acid included in the planarizing film 30 is outgassed through the holes 50.

Accordingly, if the pixel 51 is stacked on the planarizing film 30 after the outgassing, it is possible to prevent the components such as moisture and acid included in the planarizing film 30 from leaking to the organic layer (refers to the stacked structure of the hole injection layer 34, the organic EL layer 37 and the electron transport layer 38. Note that the hole injection layer 34 may be made of an inorganic material), degrading the quality of the organic layer due to the reaction with the gas released at the time of outgassing. This prevents the pixels from being shrunk.

In addition, gas components such as moisture and acid sealed in the planarizing film 30 is discharged. Thus, it is possible to prevent the electrode plate 33 from peeled off by the gas pressure of the gas component at the time of outgassing. Accordingly, when the gas leaks to the organic layer at the peripheral portion of the display section 52, the organic layer reacts with the gas, turning the peripheral portion white. This problem can also be prevented.

(Consideration Regarding Shape of Holes)

By comparing the electric resistance of the electrode plates including different shapes of holes, the inventors found out that the shape of the holes 50 illustrated in FIG. 2 is good for not interrupting the flow of the driving current in the electrode plate 33. The following shall describe details of the consideration.

Figure 8A:
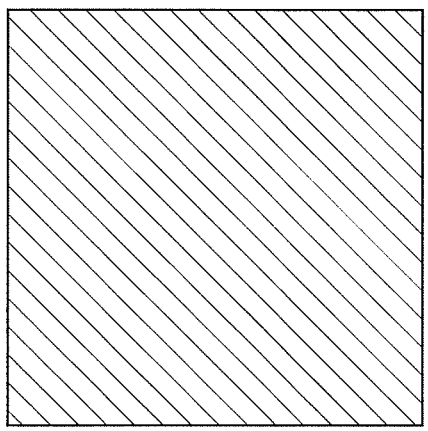
FIG. 8A is a diagram illustrating an example of the shape of electrode plate used for the comparison of electric resistance.
Figure 8B:
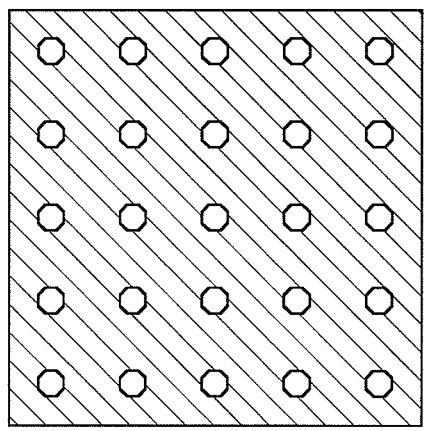
FIG. 8B is a diagram illustrating an example of the shape of electrode plate used for the comparison of electric resistance.
Figure 8C:
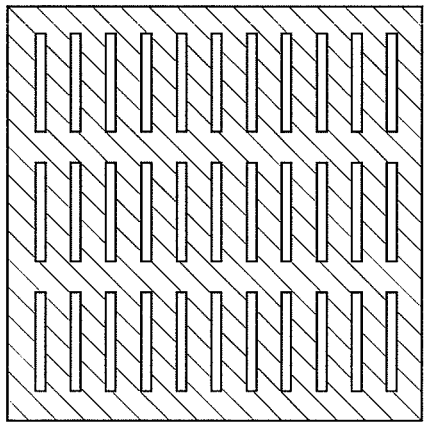
FIG. 8C is a diagram illustrating an example of the shape of electrode plate used for the comparison of electric resistance.
Figure 8D:
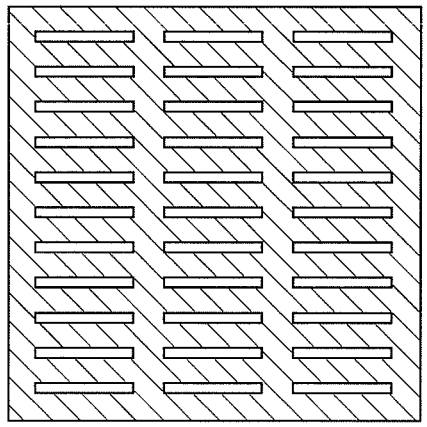
FIG. 8D is a diagram illustrating an example of the shape of electrode plate used for the comparison of electric resistance.

FIGS. 8A to 8D are diagrams illustrating examples of the shape of the electrode plates used for the comparison of electric resistance. All of the electrode plates have the same square shape and the same thickness. FIG. 8A illustrates the electrode plate with no hole. FIG. 8B illustrates octagon holes (aperture ratio 10%). FIG. 8C illustrates rectangular holes elongated in a direction perpendicular to the direction of current (aperture ratio 9%). FIG. 8D illustrates rectangular holes elongated in a direction parallel with the current direction (aperture ratio 9%).

By simulation, a resistance value is calculated from a current value when a predetermined voltage is applied to a left side and a right side of the electrode plate, and the calculated resistance value is normalized by the resistance value of FIG. 8A. The resistance values (normalized values) of the electrode plates in FIGS. 8A to 8D are 1.0, 1.2, 1.9, and 1.1, respectively.

The results show that the rectangular holes elongated in the current direction is effective for suppressing the increase in the electric resistance in the electrode plate.

Next, based on the practical condition for the electrode plate 33, it is considered whether the increase in the electric resistance falls within an acceptable range when rectangular holes elongated in the current direction are provided. As an example of the practical condition, the thickness of 0.15 μm, and the resistivity of 5.55E-8 μm are used.

Figure 9A:
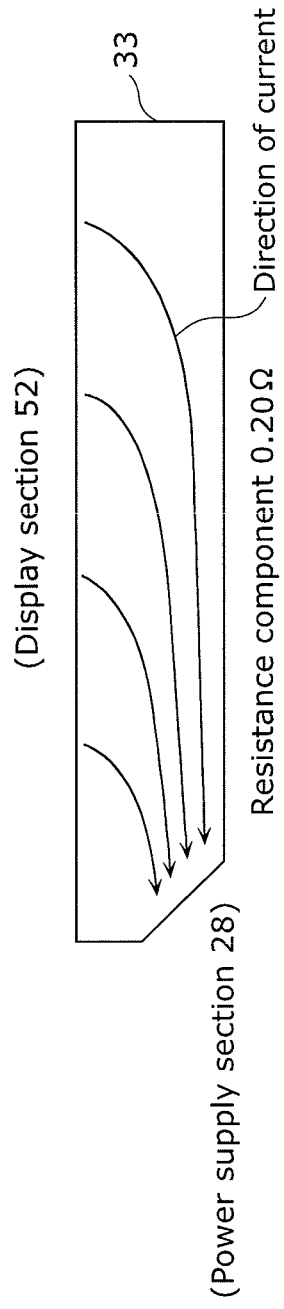
FIG. 9A is a diagram for illustrating the effect of the holes in the electrode plate in practical use.
Figure 9B:
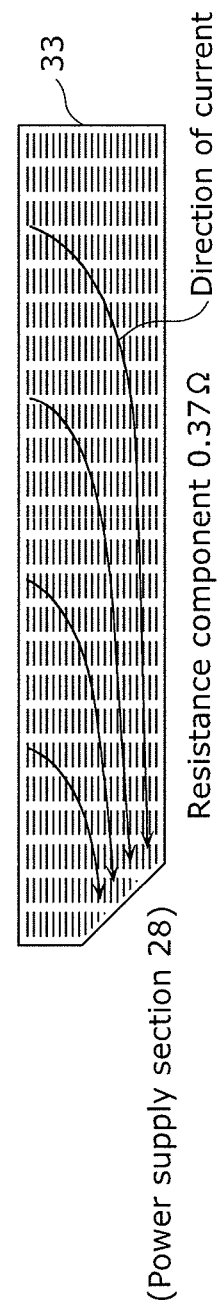
FIG. 9B is a diagram for illustrating the effect of the holes in the electrode plate in practical use.

FIGS. 9A and 9B are drawings illustrating part of the electrode plates 33 that are actually used with the holes 50 and without the holes 50. The current distribution and resistance component in the electrode plates 33 are analyzed using the finite element method. The arrows roughly indicate the current direction which is the analysis result. Note that, each of the electrode plates 33 have an upper side connected to the auxiliary electrode 32 toward the display section 52, and the lower left oblique side connected to the power supply section 28. As illustrated in FIGS. 9A and 9B, the current flowing from the connecting part of the auxiliary electrode 32 and the electrode plate 33 flows into the power supply section 28. Here, the direction of the current transitions to a direction which is along a direction parallel with the side of the display section 52 in the vicinity of the holes as the current moves closer to the power supply section 28.

As illustrated in FIG. 9A, when there is no hole, the current flowing into the upper side of the electrode plate 33 from the display section 52 flows to the power supply section 28 from the left lower oblique side of the electrode 33, and is received at the side of the triangle or the leg of the trapezoid of the power supply section 28. The resistance component of the electrode plate 33 in this case is 0.20Ω.

As illustrated in FIG. 9B, when the rectangle holes 50 elongated in a direction parallel with the adjacent side of the display section 52 are provided in the electrode plate 33, the current in the electrode plate 33 does not significantly interfered compared to the case in which there is no hole. The current flows from the display section 52 to the power supply section 28 along the holes 50, and is received at the side of the triangle or the leg of the trapezoid of the power supply section 28. The resistance component of the electrode plate 33 in this case is 0.37Ω.

The inventors confirmed that the resistance component of the electrode plate 33 when there are holes 50 falls within an acceptable range for supplying the necessary current to the display section 52 under the condition estimated by the inventors with respect to the voltage drop in the power supply and the light-emitting efficiency of the organic EL device.

According to this aspect, the holes 50 are open along the current flow between the power supply section 28 and the connecting part of the auxiliary electrode 32 and the electrode plate 33. With this, the holes 50 are adjusted to the direction of the current flow. Thus, it is possible to prevent the holes 50 from becoming the resistance of the current flow, suppressing the change in the resistance value.

In one representative example, the holes 50 are open in rectangular shape elongated in a direction parallel with the side of the display section 52 adjacent to the holes 50. With this, the rectangular shape of the opening of the holes 50 is approximated to the direction of the current flow. Thus, it is possible to suppress the opening of the holes from becoming the resistance against the current flow, suppressing the change in the resistance value.

In terms of suppressing the opening of the hole 50 from becoming a resistance of the current flowing in the electrode plate 33, the hole 50 is provided in various shapes suitable for the positional relationship of the power supply section 28 and the display section 52.

For example, as illustrated in FIGS. 1 and 2, the power supply section 28 provided at a position away from the corners of the electrode plate 33 is triangular in shape with the vertex pointed toward the display section 52.

Here, the predetermined holes 50 provided between a side of the triangle and the display section 52 among the holes 50 are open in a rectangular shape with a longer side parallel with the side of the display section 52 near the predetermined holes 50. The predetermined holes 50 are open along the current flow between the power supply section 28 and the connecting part of the auxiliary electrode 32 and the electrode plate 33. Furthermore, the predetermined holes 50 each is a rectangular opening having a longer side parallel with the side of the display section near the predetermined holes 50. This promotes the flow of current in a direction parallel with the side of the display section 52.

Since the current flown through the electrode plate 33 from the display section 52 along the holes 50 flows parallel with the side of the display section 52, the power supply section 28 receives the current with the side of the triangular shape. With this, it is possible to receive the current using the side of the triangular shape without increasing the area occupied by the power supply section 28. More specifically, the current is received using the side of the triangle which is easy to secure its length. Accordingly, the area in which the current flows in and out becomes wider along the increase in the length of the side contributing to the power supply, and thus the resistance component is reduced. Accordingly, it is possible to achieve an effect that the current is effectively supplied while suppressing the area occupied by the power supply section 28 relatively small.

The same shape of the holes 50 described above is adopted not only in a region near the triangular power supply section 28 provided in the lower side and the right side of the electrode plate 33 illustrated in FIG. 2, but also in a region near the triangular power supply section 28 provided in the upper side and the left side of the electrode plate 33 in FIG. 1.

In addition, for example, as illustrated in FIGS. 1 and 2, the power supply section 28 provided at the corner of each side of the electrode plate 33 is trapezoidal with the upper base facing the display section 52.

In this case, the power supply section 28 is trapezoidal with the upper base facing the display section 52, and the predetermined holes 50 (illustrated as four slits having sides of a same shorter length on the line CC' in FIG. 2) each is a rectangular opening having a shorter side parallel with the side of the display section 52 near the predetermined holes 50. The predetermined holes 50 are open along the current flow between the power supply section 28 and the connecting part of the auxiliary electrode 32 and the electrode plate 33.

The power supply section 28 which is trapezoidal provided at the corner of each side of the electrode plate 33 receives the current flown from the display section 52 through the electrode plate 33 along the hole 50 with the legs and the upper base of the trapezoidal shape. With this, it is possible to receive the current with the upper base of the trapezoidal shape, without increasing the area occupied by the power supply section 28. More specifically, the current is received using the legs of the trapezoidal shape which relatively allows securing the length, and the upper base of the trapezoidal shape. Accordingly, the area which allows the current flown in and out increases as the length of the side contributing to the power supply increases, which reduces the resistance component. Accordingly, it is possible to achieve an effect that the current is effectively supplied while suppressing the area occupied by the power supply section 28 relatively small.

The shape of the holes 50 described above is adopted in the same manner near the power supply section 28 in the trapezoidal shape provided at the left end of the lower side and at the both ends on the upper side of the electrode plate 33, not only from the section near the power supply section 28 in the trapezoidal shape provided on the right end of the lower side of the electrode plate 33 illustrated in FIG. 2.

Alternatively, as illustrated in FIG. 3, for example, the power supply section 28 provided at a position away from the corner of the lower side and the right side of the electrode plate 33 may be the trapezoidal shape having the upper base facing the display section 52.

Here, each of the predetermined holes 50 provided between a leg of the trapezoid and the display section 52 among the holes 50 is open in a rectangular shape with a longer side parallel with the side of the display section 52 near the predetermined holes 50. The predetermined holes 50 are open along the current flow between the power supply section 28 and the connecting part of the auxiliary electrode 32 and the electrode plate 33. Furthermore, the predetermined holes 50 each is a rectangular opening having a longer side parallel with the side of the display section near the predetermined holes 50. This promotes the flow of current in a direction parallel with the side of the display section 52.

Since the current flown through the electrode plate 33 from the display section 52 along the holes 50 flows parallel with the side of the display section 52, the power supply section 28 receives the current with the legs of the trapezoid. With this, it is possible to receive the current using the leg of the trapezoid without increasing the area of the power supply section 28. More specifically, the current is received using the legs of the trapezoid which is relatively easy to maintain the length. Accordingly, the area which allows the current flown in and out increases as the length of the side contributing to the power supply increases, which reduces the resistance component. Accordingly, it is possible to achieve an effect that the current is effectively supplied while suppressing the area occupied by the power supply section 28 relatively small.

The same shape of the holes 50 described above may be adopted not only in a region near the trapezoidal power supply section 28 provided in the lower side and the right side of the electrode plate 33 illustrated in FIG. 3, but also in a region near the trapezoidal power supply section 28 provided in the upper side and the left side of the electrode plate 33.

Note that, in order to reduce the resistance of the electrode plate 33, the holes 50 may be provided with the direction gradually changing strictly along the direction of the current illustrated in FIG. 9A in the direction of the longer side of the rectangle. However, forming the holes 50 in the complex shape described above would likely to cause defect in the shape of the holes 50 such as obstruction or connection, which may reduce yield. Furthermore, it is very difficult to precisely calculate the direction of the current for arranging all of the holes 50. In addition, if the holes 50 are arranged along the current flow illustrated in FIG. 9A, even if the arrangement of the holes is along some current flow, the arrangement could interrupt other current flow.

With this, as illustrated in FIG. 9B, for example, all of the holes 50 are arranged in the predetermined direction along the main direction of the current. With the arrangement, the current flow is formed as a whole including each current flow. Consequently, the holes 50 are less likely to interrupt the current flow, achieving an effect of reduced resistance in the electrode plate 33. The holes 50 not arranged in a constant direction prevent a smooth flow of current from formed.

(Fabrication Method for Display Panel Apparatus)

Next, the method of fabricating the display panel apparatus according to the embodiment of the present invention shall be described. The method of fabricating the display panel apparatus according to the embodiment of the present invention is characterized by a process for providing holes in a preferred shape in the electrode plate on the planarizing film and a process for outgassing the planarizing film through the holes.

The method of fabricating the display panel apparatus according to the embodiment of the present invention shall be described in detail with reference to the drawings.

Figure 10:
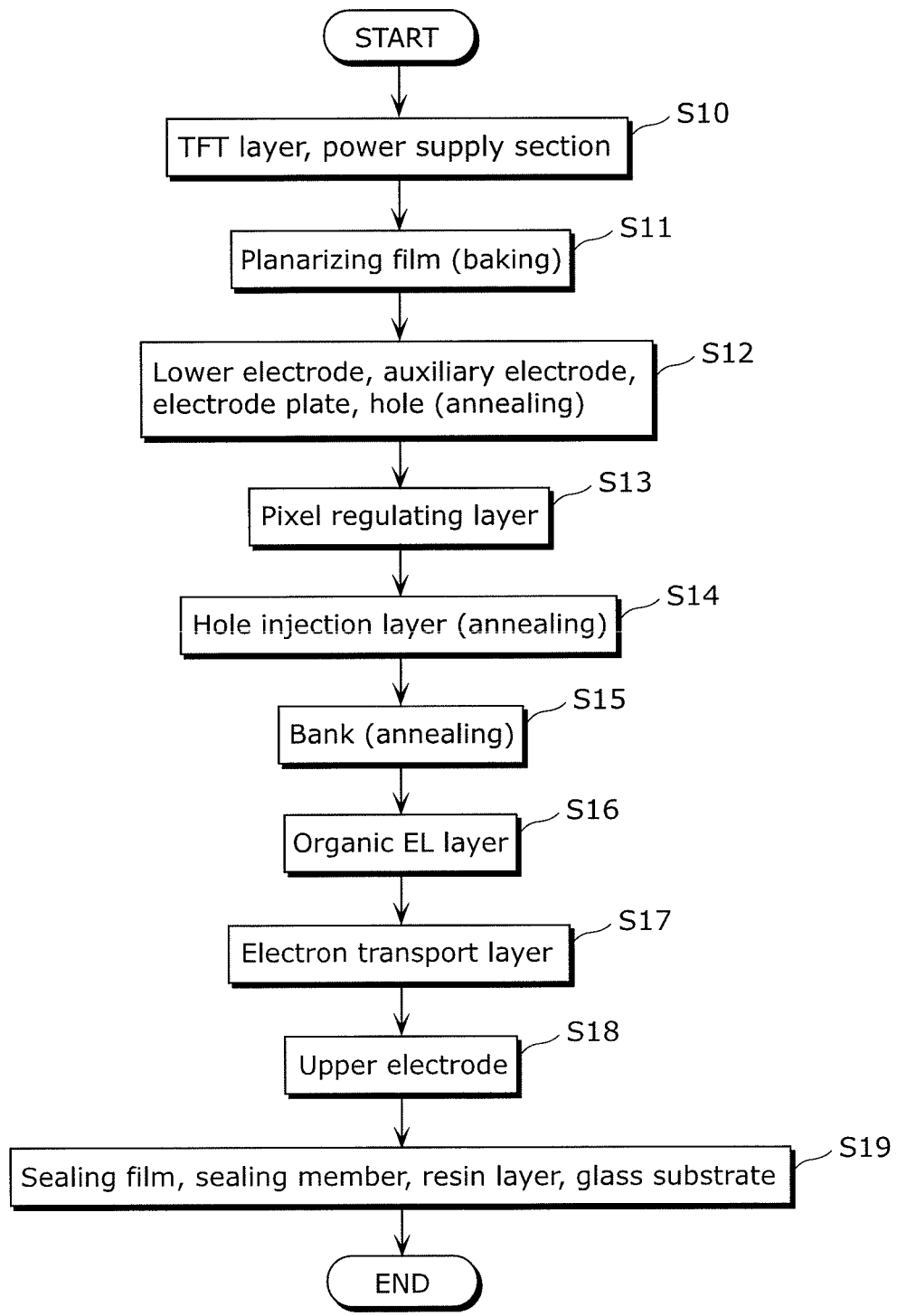
FIG. 10 is a flowchart illustrating the fabrication process of the display panel apparatus according to the embodiment.

FIG. 10 is a flowchart illustrating an example of the fabrication process of the display panel apparatus according to the embodiment in the present invention. The example in which the display panel apparatus 1 described above is fabricated shall be described based on FIG. 10 and with reference to FIGS. 2 and 4.

Note that, the following processes can be performed using the known processing technologies. Thus, detailed description for the processing conditions shall be omitted where appropriate. In addition, the material and process described below are merely typical examples, and the display panel apparatus and the method of fabricating the display panel apparatus according to the present invention are not limited to the example. The present invention includes a case in which other materials and processes which are known as appropriate are used.

First, the TFT layer 20 including the driver element 25 and the power supply section 28 is formed by forming and patterning a semiconductor film, an insulating film, and a metal film on the main surface of the substrate 10 made of glass or plastic (S10: first process).

The planarizing film 30 is formed by applying insulating organic material such as polyimide resin by spin coating or nozzle coating on an entire surface and baking the surface. The interlayer insulating film 26 and the planarizing film 30 formed above the source-drain electrode 24 of the driver element 25, and the planarizing film 30 formed above the power supply section 28 are removed by photo etching (S11: second process).

A metal film is formed above the planarizing film 30 by sputtering, and the metal film is patterned into the lower electrode 31, the auxiliary electrode 32, and the electrode plate 33 with the shape illustrated in FIG. 5 by photo etching. Here, the holes 50 reaching the planarizing film 30 underneath are formed in the electrode plate 33 such that the part of the surface of the planarizing film 30 is exposed. The lower electrode 31, the auxiliary electrode 32, and the electrode plate 33 are annealed (S12: third process).

In this process, in the part in which the interlayer insulating film 26 and the planarizing film 30 are removed, the lower electrode 31 and the source-drain electrode 24 of the driver element 25 are electrically connected, and the electrode plate 33 and the power supply section 28 are electrically connected. With this annealing heat treatment, the components such as moisture and acid remaining in the planarizing film 30 is outgassed through the holes 50.

Next, a film made of insulating inorganic material such as $SiO_2$, SiN, SiON, $Al_2O_3$, and AlN, or a film made of insulating organic material such as polyimide resin is formed on the lower electrode 31, and photo-etched to form the pixel regulating layer 35 (S13: seventh process).

The hole injection layer 34 is formed by applying an organic material such as poly(3,4-ethylenedioxythiophene) (PEDOT) on a region to be the display section 52 by the ink-jet method or nozzle coating, and annealing the region (S14: eighth process). Alternatively, the hole injection layer 34 may be formed by depositing at least one of the inorganic materials such as W, Ti, Mo, V, Ga, and annealing the inorganic material.

In this process, the component such as moisture or acid remaining in the planarizing film 30 is outgassed from the holes 50 that are not covered with the hole injection layer 34 by the annealing heat treatment.

The banks 36 in a shape illustrated in FIGS. 2 and 3 are formed by applying photosensitive polyimide resin by spin coating and nozzle coating on the entire surface, and performing patterning by photolithography and annealing (S15: fourth process).

In this process, the component such as moisture or acid remaining in the planarizing film 30 is outgassed from the holes 50 that are not covered with the bank 36 by the annealing heat treatment.

The organic EL layer 37 is formed by placing functional fluid including organic material with electroluminescent property such as tris(8-hydroxyquinolinato)aluminium (Alq3) on the belt-shaped region partitioned by adjacent banks 36 by the ink-jet method, and drying the functional fluid (S16: fifth process).

The electron transport layer 38 is formed by depositing organic material made of oxadiazole derivatives and others by vacuum vapor deposition (S17: ninth process).

Next, the upper electrode 39 is formed by depositing transparent conductive material such as Indium Tin Oxide or Indium Zinc Oxide by vacuum vapor deposition (S18: sixth process).

Finally, fabrication of the display panel apparatus 1 is complete by providing the sealing film 40, the resin layer 60, the sealing member 61, and the glass substrate 70 (S19). Note that, instead of the glass substrate 70, a color filter substrate and others may be provided, for example.

According to this aspect, holes 50 exposing part of the surface of the planarizing film 30 are provided in the electrode plate 33 covering the planarizing film 30. Subsequently, the planarizing film 30 is outgassed through the holes 50 in the electrode plate 33. After that, the electrode plate 33 is covered with the upper electrode 39, electrically connecting the auxiliary electrode 32 and the upper electrode 39.

With this, even if the planarizing film 30 with the components such as moisture and acid absorbed inside is covered with the electrode plate 33, the components included in the planarizing film 30 is outgassed through the holes 50. Accordingly, if the pixel 51 is stacked on the planarizing film 30 in this state, the components such as moisture and acid included in the planarizing film 30 leaks to the organic layer (refers to the stacked structure of the hole injection layer 34, the organic EL layer 37, and the electron transport layer 38 made of organic material), degrading the quality of the organic layer due to the reaction with the gas released at the time of outgassing. This prevents the pixels from being shrunk.

In addition, the components such as moisture and acid sealed in the planarizing film 30 are discharged. Thus, it is possible to prevent the electrode plate 33 from peeled off by the gas pressure of the gas component at the time of outgassing. Accordingly, when the gas leaks to the organic layer at the peripheral portion of the display section 52 at the time of outgassing, the organic layer reacts with the gas, turning the peripheral portion white. This problem can also be prevented.

(Examples of the Usage of Display Panel Apparatus)

The display panel apparatus 1 described above is used for a display apparatus for a television set, for example.

Figure 11:
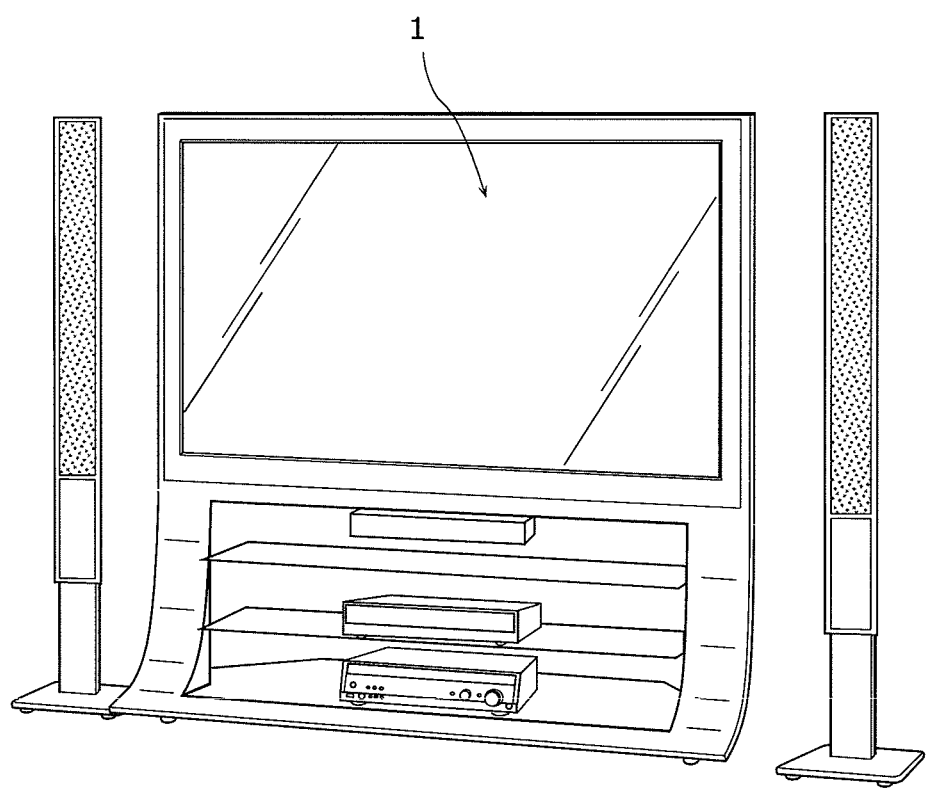
FIG. 11 is an external view illustrating an example of a television set using the display panel apparatus.

FIG. 11 is an external view of the television set as an example of the display apparatus using the display panel apparatus 1. According to the embodiment, the display panel apparatus 1 may be used for the display apparatus.

The display panel apparatus 1 may be used as any display apparatus for mobile phones, personal computers, and others, in addition to the television set described above.

Although only an exemplary embodiment of the present invention has been described in detail above, those skilled in the art will readily appreciate that many modifications are possible in the exemplary embodiment without materially departing from the novel teachings and advantages of the present invention. Accordingly, all such modifications are intended to be included within the scope of the present invention.

Figure 12:
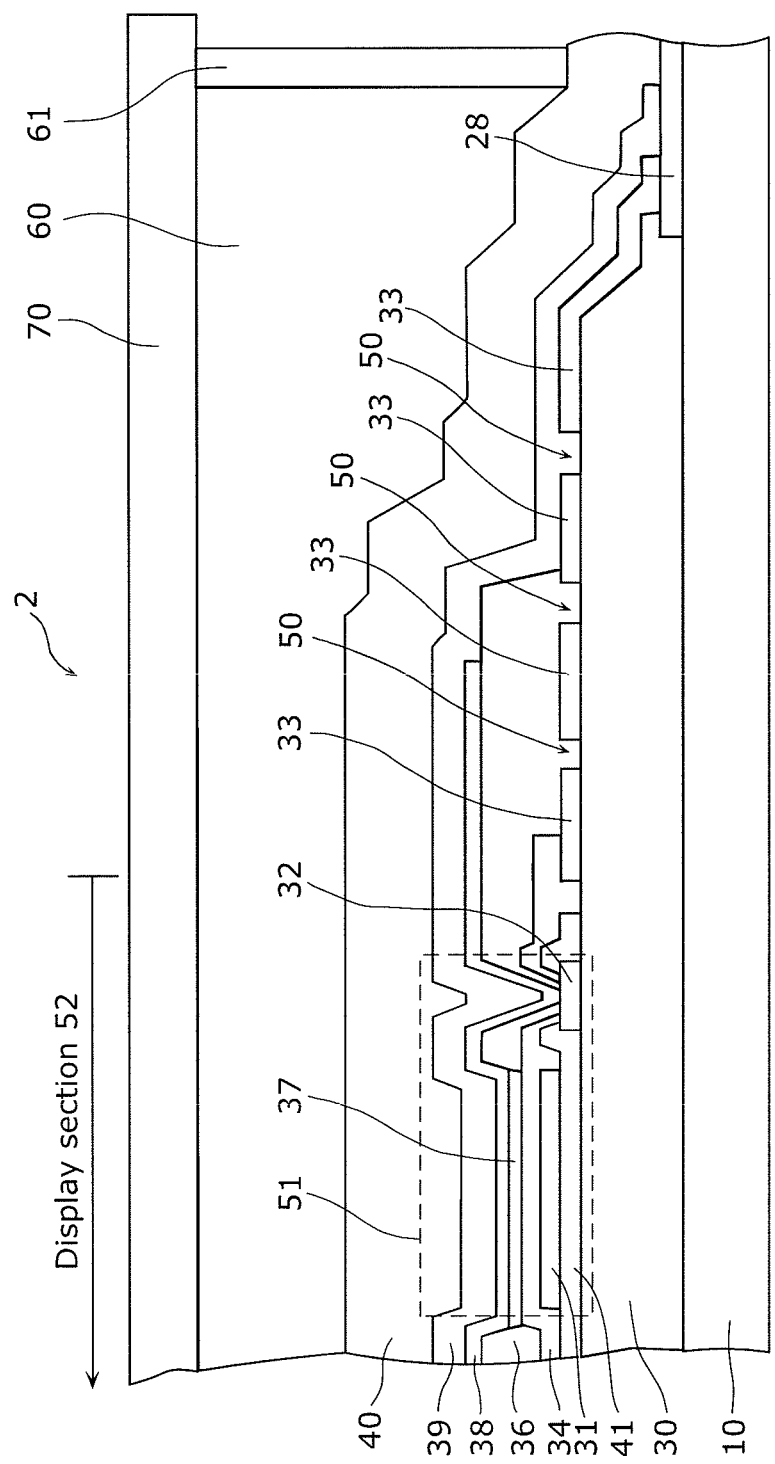
FIG. 12 is a cross-sectional view illustrating an example of the configuration of the display panel apparatus according to the variation.
Figure 13:
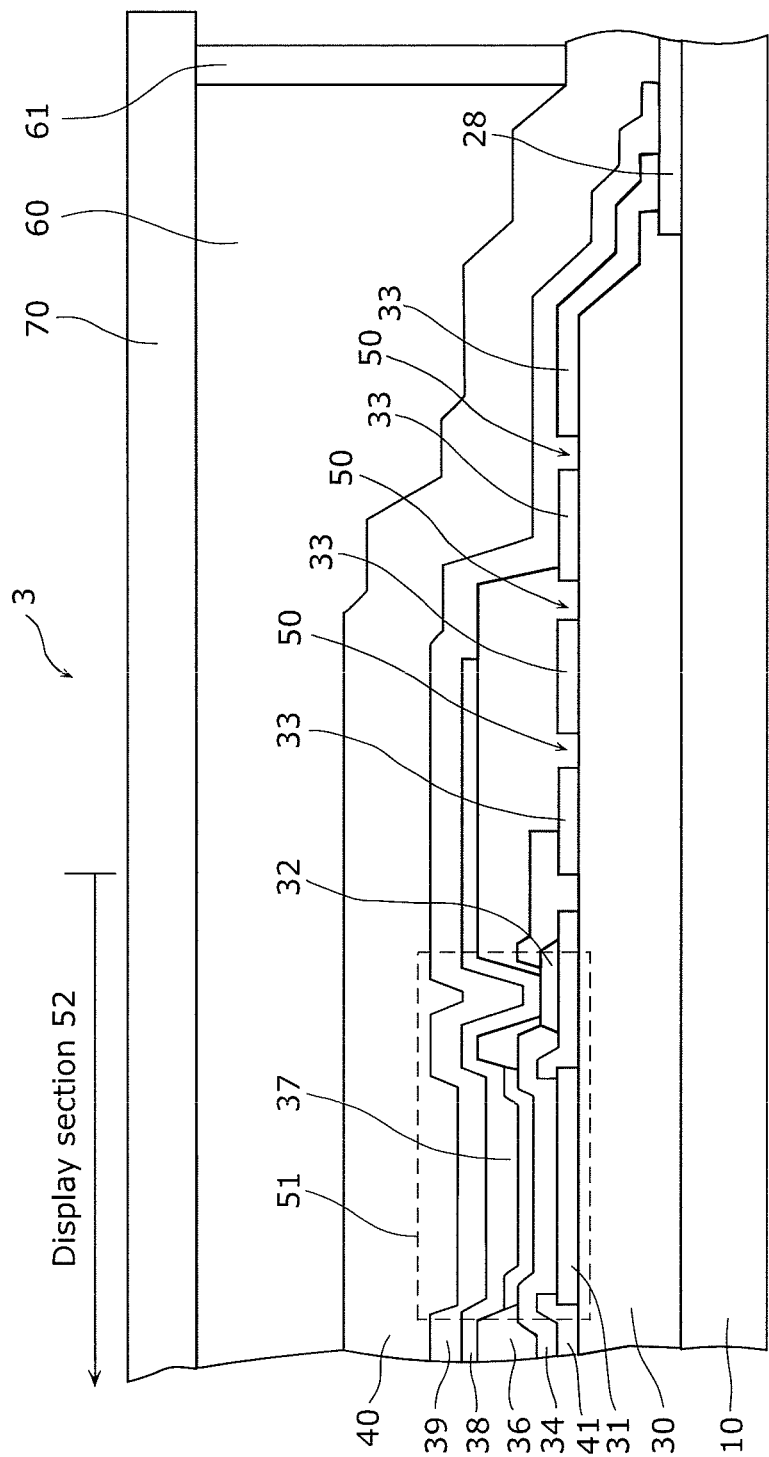
FIG. 13 is a cross-sectional view illustrating an example of the configuration of the display panel apparatus according to the variation.

For example, as illustrated in FIG. 12 or 13, the lower electrode 31 and the auxiliary electrode 32 may be formed in different layers interposing the insulating film 41.

FIG. 12 is a cross-sectional view illustrating an example of the configuration of the display panel apparatus 2 according to the variation. FIG. 12 illustrates a cross-sectional surface corresponding to the cross-sectional surface of the display panel apparatus 1 illustrated in FIG. 4.

As illustrated in FIG. 12, in the display panel apparatus 2, the auxiliary electrode 32 is arranged on an upper surface of the planarizing film 30, and the lower electrode 31 and the electrode plate 33 are provided on the upper surface of the insulating film 41 covering the auxiliary electrode 32.

With this configuration, the lower electrode 31 and the auxiliary electrode 32 are electrically insulated by the insulating film 41, increasing flexibility in arrangement of the auxiliary electrode 32.

For example, arranging the auxiliary electrode 32 in a wide region overlapping the lower electrode 31 in planar view and in a different layer from the lower electrode 31 interposing the insulating film 41 allows reducing the electric resistance of the auxiliary electrode 32, and stably supplying more operational current.

FIG. 13 is a cross-sectional view illustrating an example of the configuration of the display panel apparatus 3 according to the variation. FIG. 13 illustrates a cross-sectional surface corresponding to the cross-sectional surface of the display panel apparatus 1 illustrated in FIG. 4.

As illustrated in FIG. 13, in the display panel apparatus 3, the lower electrode 31 and the electrode plate 33 may be provided on an upper surface of the planarizing film 30, and the auxiliary electrode 32 may be provided on the upper surface of the insulating film 41 covering the lower electrode 31 and the planarizing film 30. More specifically, the auxiliary electrode 32 may be provided in a layer above the lower electrode 31.

Figure 14:
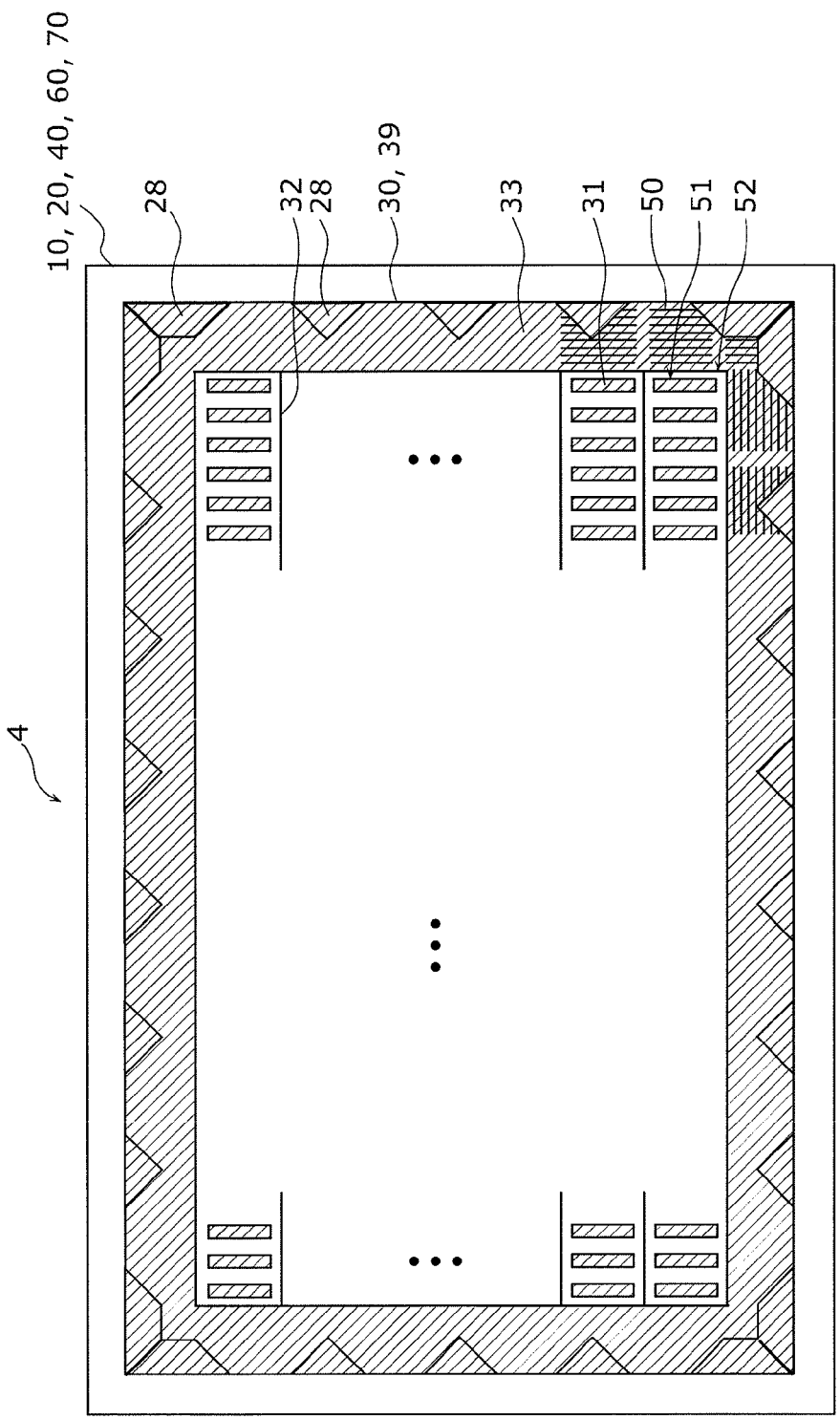
FIG. 14 is a plan view illustrating an example of the configuration of the display panel apparatus according to the variation.

As illustrated in the display panel apparatus 4 in FIG. 14, the auxiliary electrode 32 may be provided in a direction perpendicular to the banks 36. Alternatively, as in FIG. 15, the auxiliary electrodes 32 may be provided along the direction both parallel with the banks 36 and perpendicular to the banks 36.

Figure 15:
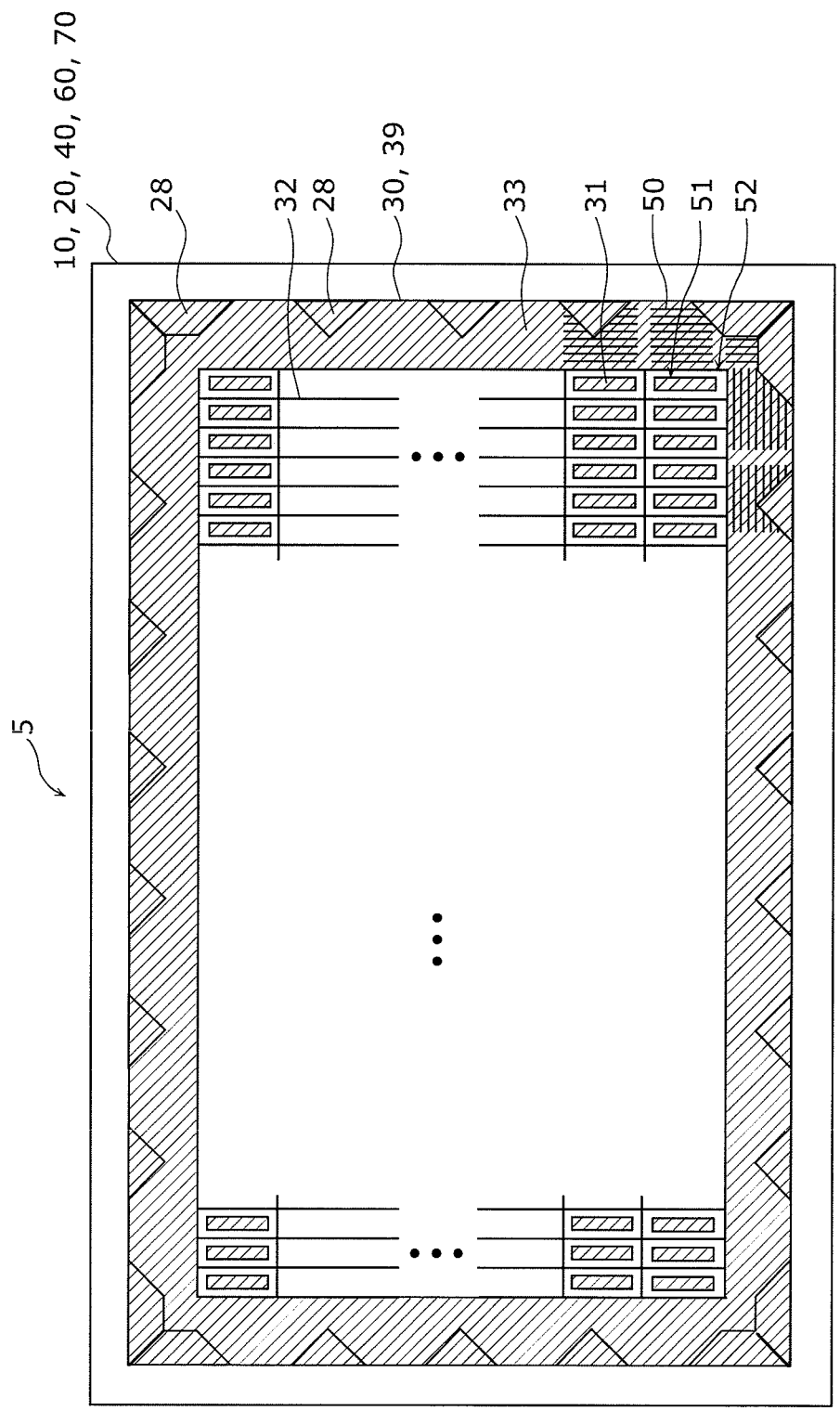
FIG. 15 is a plan view illustrating an example of the configuration of the display panel apparatus according to the variation.

FIG. 15 is a plan view illustrating an example of the configuration of the display panel apparatus 5 according to the variation.

The banks that are not illustrated are provided in the display panel apparatus 5 in the vertical direction of the drawing, in the same manner as the display panel apparatus 1. The auxiliary electrodes 32 are provided in both perpendicular direction and horizontal direction of the banks.

Furthermore, the specific arrangement of the holes 50 is not limited to the example illustrated in FIG. 2. For example, there is another arrangement of the holes 50 suitable for a color display panel apparatus in which one pixel includes three sub pixels each of which emits light in red, green, or blue.

Figure 16:
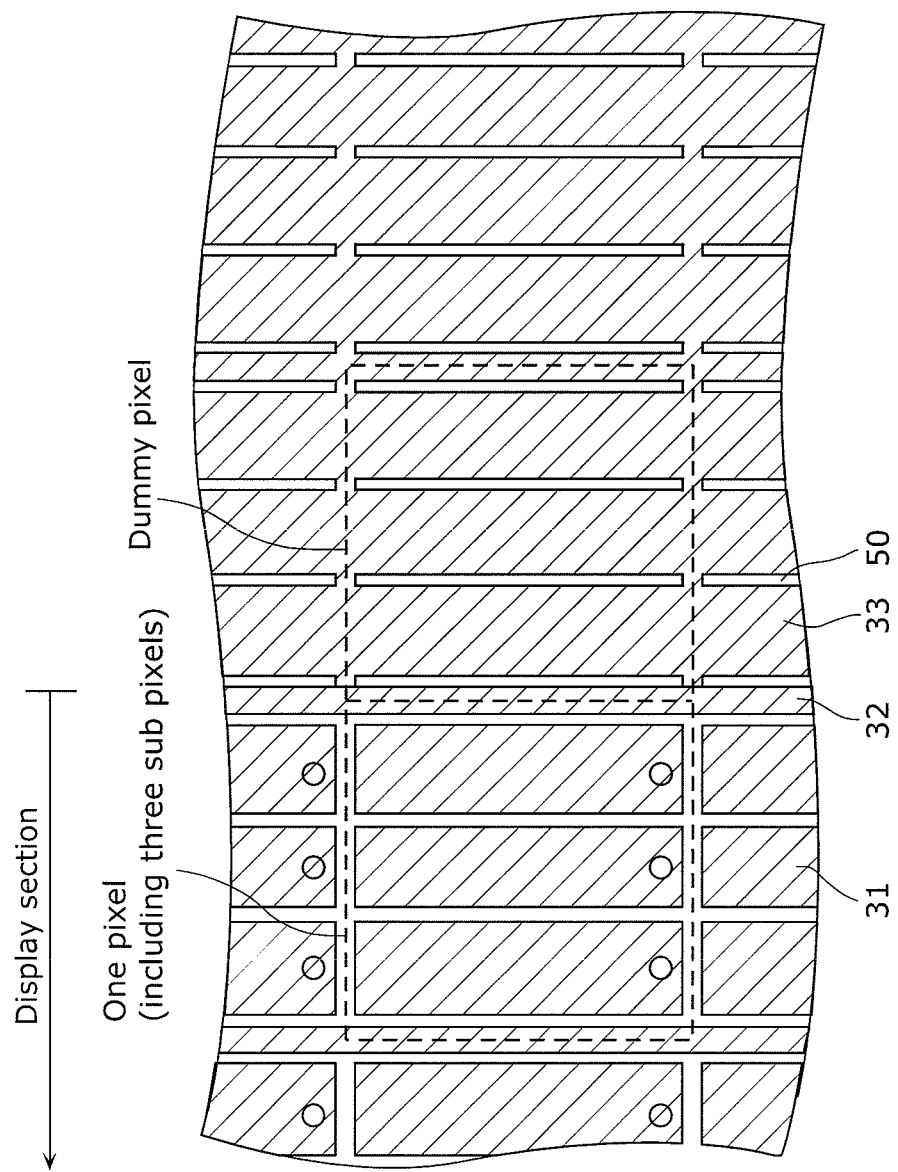
FIG. 16 is a plan view schematically illustrating an example of the arrangement of holes according to the variation.

FIG. 16 is a plan view schematically illustrating an example of the arrangement of holes 50 according to the variation.

In FIG. 16, areas in which the lower electrodes 31, the auxiliary electrodes 32, and the electrode plate 33 are provided are indicated by hatching. Small circles indicate contact holes for connecting the lower electrode 31 and the driver element in a lower layer. In addition, banks that are not illustrated are provided in perpendicular direction between the lower electrodes which are adjacent to each other in horizontal direction and between the lower electrodes 31 and the auxiliary electrodes 32.

In the display section, three adjacent belt-shaped regions partitioned by the banks form one pixel column, and the organic EL layers each of which emits light in red, green, or blue are provided in the three belt-shaped regions. With this, the three sub pixels each of which emits light in red, green, or blue are arranged next to one another in horizontal direction, and the three sub pixels form one pixel.

The holes are formed in the shape of dummy pixels mocking the shape of the pixels in the display section. More specifically, one pixel in the display section and one dummy pixel in the holes have the same size, and the holes 50 are formed in the dummy pixels at a position same as the position in the pixels in which the lower electrode 31 and the auxiliary electrode 32 are separated (the plain part between the adjacent lower electrodes 31 and between the lower electrodes 31 and the auxiliary electrodes 32).

According to the arrangement of the holes 50, the lower electrodes 31, the auxiliary electrodes 32, and the electrode plate 33 are formed by repeating the approximately same shape from the display section to the holes, making the aperture ratio of the planarizing film uniform.

With this, the gas included in the planarizing film is outgassed at a same level in the display section and the region outside of the display section, preventing the components such as moisture and acid from excessively trapped in the planarizing film outside the display section. Thus, it is possible to reduce defects of shrinking pixels at the peripheral portion of the display section, or the peripheral portion turning white.

Figure 17:
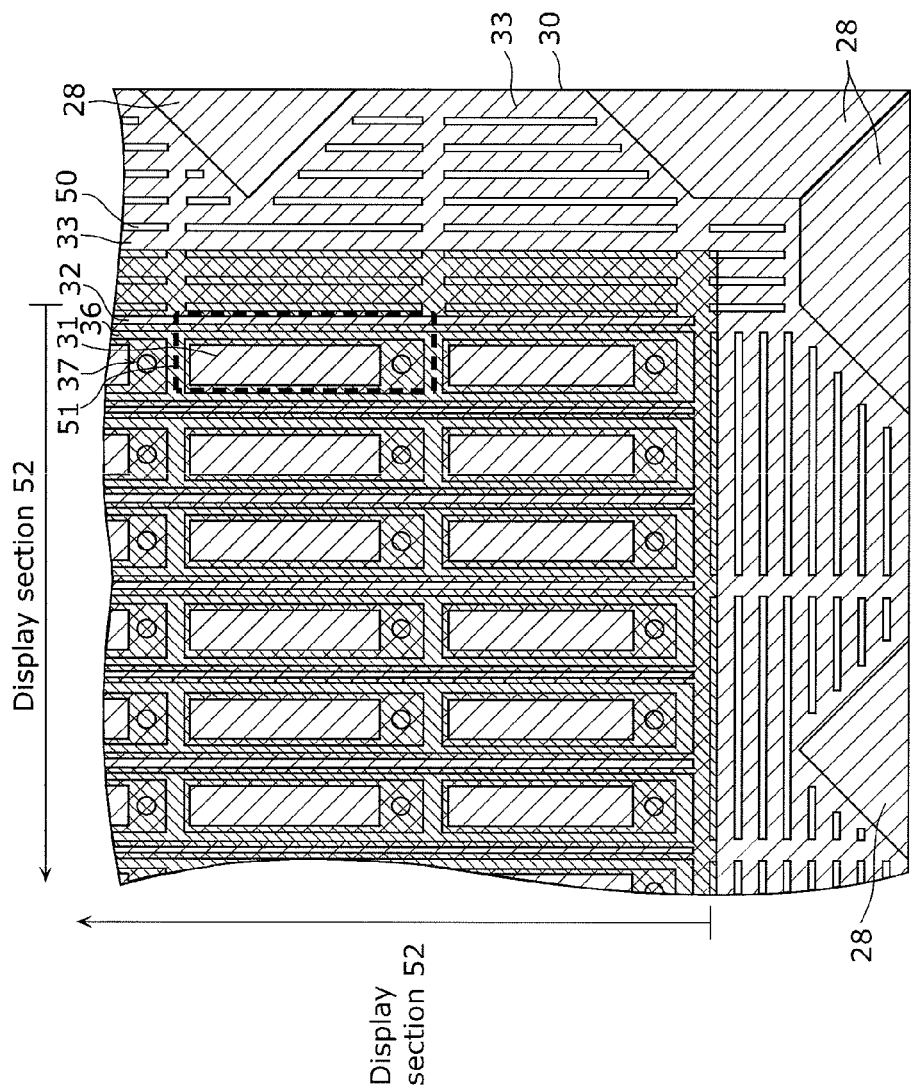
FIG. 17 is an enlarged plan view illustrating an example of the configuration of the display panel apparatus according to the variation.

FIG. 17 is an enlarged planar view illustrating an example of the configuration of the display panel apparatus according to the variation.

As illustrated in FIG. 17, in this variation, the banks 36 are provided in both vertical direction and horizontal direction of the drawing. In the embodiment, the pixels 51 arranged in the vertical direction of the drawing are partitioned by the pixel regulating layer. In the configuration according to the variation, the pixels 51 are partitioned by the banks 36 in both vertical direction and horizontal direction of the drawing. Accordingly, the pixel regulating layer can be omitted.

In FIG. 17, the auxiliary electrodes 32 are provided along the vertical direction in the display section 52 outside of the region in which the lower electrodes 31 are formed. However, the auxiliary electrodes 32 may be formed along the horizontal direction in the display section 52 outside of the region in which the lower electrode 31 is formed.

Note that, the embodiments illustrate configurations in which the lower electrodes 31 are used as the anode and the upper electrode 39 is used as the cathode, for example. However, the lower electrodes 31 may be used as the cathode, and the upper electrode 39 may be used as the anode. In this case, the electron transport layer 38 is arranged below the organic EL layer 37, and the hole injection layer 34 is arranged above the organic EL layer 37.

In the embodiment, the stacked structure of the hole injection layer 34, the organic EL layer 37 and the electron transport layer 38 are described as an example of the organic layer. However, the configuration of the organic layer is not limited to this example. For example, a known stacked structure including five layers, namely, the hole injection layer, the hole transport layer, the organic EL layer, the electron transport layer, and the electron injection layer may be used as the organic layer. Furthermore, the four layers other than the organic EL layer are provided where appropriate for achieving good light-emission performance, and can be omitted. More specifically, a configuration which does not include one of or both of the hole injection layer 34 and the electron transport layer 38 is possible.

INDUSTRIAL APPLICABILITY

The display panel apparatus according to the present invention is applicable to any display apparatus for television sets, mobile phones, personal computers, and others.

The invention claimed is:

1. A display panel apparatus comprising:
   a substrate;
   a planarizing film provided on the substrate;
   a plurality of pixels provided on the planarizing film, each pixel including: a lower electrode; an organic layer; and an upper electrode;
   an auxiliary electrode electrically insulated from the lower electrode and electrically connected to the upper electrode;
   a display including the plurality of pixels;
   an electrode plate electrically connected to the auxiliary electrode and arranged to cover the planarizing film outside the display; and
   a power supply electrically connected to the electrode plate,
   wherein the electrode plate has a hole exposing a portion of a surface of the planarizing film,
   the hole extends in parallel with a side of the display near the hole,
   current flowing between the power supply and a portion connecting the auxiliary electrode and the electrode plate flows along an extending direction of the hole, and
   the power supply has a trapezoid shape with an upper base facing the display, and receives current flowing along the hole from the display at legs of the trapezoid.

2. The display panel apparatus according to claim 1, wherein the hole outgasses the planarizing film.

3. The display panel apparatus according to claim 1, wherein the organic layer is provided in a region partitioned by banks which partition the plurality of pixels,
   the lower electrode is provided between the organic layer and the planarizing film,
   the auxiliary electrode is provided at a predetermined interval from the lower electrode, outside of a region in which the lower electrode is provided; and
   the hole is an opening having a width corresponding to the predetermined interval between the lower electrode and the auxiliary electrode.

4. The display panel apparatus according to claim 1, wherein the organic layer is provided in a region partitioned by banks which partition the plurality of pixels,
   the banks extend in a predetermined direction in the display, and
   the auxiliary electrode extends in the predetermined direction, and is provided outside of a region in which the lower electrode is provided.

5. The display panel apparatus according to claim 1, wherein the organic layer is provided in a region partitioned by banks which partition the plurality of pixels,
   the banks extend in a predetermined direction in the display, and
   the auxiliary electrode extends in a direction perpendicular to the predetermined direction, and is provided outside of a region in which the lower electrode is provided.

6. The display panel apparatus according to claim 1, wherein the organic layer is provided in a region partitioned by banks which partition the plurality of pixels,
   the banks extend in parallel with each other in a predetermined direction in the display, and
   the auxiliary electrode comprises a first auxiliary electrode extending in the predetermined direction and a second auxiliary electrode extending in a direction perpendicular to the predetermined direction, and both the first auxiliary electrode and the second auxiliary electrode are provided outside of a region in which the lower electrode is provided.

7. The display panel apparatus according to claim 1, wherein the organic layer is provided in a region partitioned by banks which partition the pixels,
   the banks extend in the display in a row direction along the plurality of pixels and in a column direction along the plurality of pixels, and
   the auxiliary electrode is provided to extend either in the row direction or in the column direction, outside of a region in which the lower electrode is provided.

8. The display panel apparatus according to claim 1, wherein the lower electrode is provided below the organic layer and on an upper surface of the planarizing film, and
   the auxiliary electrode is provided in a layer same as a layer in which the lower electrode is provided, and on the upper surface of the planarizing film.

9. The display panel apparatus according to claim 1, wherein the auxiliary electrode is provided either above or below the lower electrode.

10. The display panel apparatus according to claim 9, further comprising
    an insulating film provided between the organic layer and the planarizing film,
    wherein the lower electrode is provided below the organic layer and on an upper surface of the insulating film, and
    the auxiliary electrode is provided below the lower electrode and on an upper surface of the planarizing film.

11. The display panel apparatus according to claim 1, wherein the organic layer includes an organic EL layer containing an organic luminescent material.

12. The display panel apparatus according to claim 11, wherein the upper electrode is a cathode,
    the lower electrode is an anode, and
    the organic layer includes one of a hole injection layer which injects holes from the lower electrode to the organic EL layer and an electron transport layer which transports electrons from the upper electrode to the organic EL layer.

13. The display panel apparatus according to claim 11, further comprising
    a TFT layer having a driver element that drives the plurality of pixels, the TFT layer being provided between the substrate and the planarizing film.

14. A display apparatus comprising
    the display panel apparatus according to claim 11,
    wherein the plurality of pixels in the display panel apparatus are arranged in a matrix.

15. The display panel apparatus according to claim 1, wherein the hole has a rectangle shape.

16. A display panel apparatus comprising:
    a substrate;
    a planarizing film provided on the substrate;
    a plurality of pixels provided on the planarizing film, each pixel including: a lower electrode; an organic layer; and an upper electrode;
    an auxiliary electrode electrically insulated from the lower electrode and electrically connected to the upper electrode;
    a display including the plurality of pixels;
    an electrode plate electrically connected to the auxiliary electrode and arranged to cover the planarizing film outside the display; and
    a power supply electrically connected to the electrode plate,
    wherein the electrode plate has a hole exposing a portion of a surface of the planarizing film,
    the hole extends in parallel with a side of the display near the hole, current flowing between the power supply and a portion connecting the auxiliary electrode and the electrode plate flows along an extending direction of the hole, and the power supply has a triangle shape with a vertex pointing toward the display, and receives current flowing along the hole from the display at sides of the triangle, which meet at the vertex.

17. A display panel apparatus comprising:
a substrate;
a planarizing film provided on the substrate;
a plurality of pixels provided on the planarizing film, each pixel including: a lower electrode; an organic layer; and an upper electrode;
an auxiliary electrode electrically insulated from the lower electrode and electrically connected to the upper electrode;
a display including the plurality of pixels;
an electrode plate electrically connected to the auxiliary electrode and arranged to cover the planarizing film outside the display; and
a power supply electrically connected to the electrode plate,
wherein the electrode plate has a plurality of holes exposing a portion of a surface of the planarizing film,
the power supply has a triangle shape with a vertex pointing toward the display,
among the plurality of holes, a predetermined hole provided between a side of the triangle and the display comprises a rectangular opening with a longer side extending in parallel with a side of the display near the predetermined hole, and
current flowing between the power supply and a portion connecting the auxiliary electrode and the electrode plate flows along the longer side of the predetermined hole.

18. A display panel apparatus comprising:
a substrate;
a planarizing film provided on the substrate;
a plurality of pixels provided on the planarizing film, each pixel including: a lower electrode; an organic layer; and an upper electrode;
an auxiliary electrode electrically insulated from the lower electrode and electrically connected to the upper electrode;
a display including the plurality of pixels;
an electrode plate electrically connected to the auxiliary electrode and arranged to cover the planarizing film outside the display; and
a power supply electrically connected to the electrode plate,
wherein the electrode plate has a plurality of holes exposing a portion of a surface of the planarizing film,
the power supply has a trapezoid shape with an upper base facing the display,
among the plurality of holes, a predetermined hole provided between the upper base of the trapezoid and the display comprises a rectangular opening with a shorter side parallel with a side of the display near the predetermined hole, and
current flowing between the power supply and a portion connecting the auxiliary electrode and the electrode plate flows along a longer side of the rectangular opening of the predetermined hole.

19. A display panel apparatus comprising:
a substrate;
a planarizing film provided on the substrate;
a plurality of pixels provided on the planarizing film, each pixel including: a lower electrode; an organic layer; and an upper electrode;
an auxiliary electrode electrically insulated from the lower electrode and electrically connected to the upper electrode;
a display including the plurality of pixels;
an electrode plate electrically connected to the auxiliary electrode and arranged to cover the planarizing film outside the display; and
a power supply electrically connected to the electrode plate,
wherein the electrode plate has a plurality of holes exposing a portion of a surface of the planarizing film,
the power supply has a trapezoid shape with an upper base facing the display,
among the plurality of the holes, a predetermined hole provided between a leg of the trapezoid and the display comprises a rectangular opening with a longer side extending in parallel with a side of the display near the predetermined hole, and
current flowing between the power supply and a portion connecting the auxiliary electrode and the electrode plate flows along the longer side of the predetermined hole.

* * * * *